(12) United States Patent
Yoshikawa et al.

(10) Patent No.: US 8,003,284 B2
(45) Date of Patent: Aug. 23, 2011

(54) PHOTOMASK BLANK AND PHOTOMASK

(75) Inventors: Hiroki Yoshikawa, Joetsu (JP); Yukio Inazuki, Joetsu (JP); Satoshi Okazaki, Joetsu (JP); Takashi Haraguchi, Tokyo (JP); Tadashi Saga, Tokyo (JP); Yosuke Kojima, Tokyo (JP); Kazuaki Chiba, Tokyo (JP); Yuichi Fukushima, Tokyo (JP)

(73) Assignees: Shin-Etsu Chemical Co., Ltd., Tokyo (JP); Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 12/820,918

(22) Filed: Jun. 22, 2010

(65) Prior Publication Data
US 2010/0261100 A1 Oct. 14, 2010

Related U.S. Application Data

(62) Division of application No. 11/715,346, filed on Mar. 8, 2007, now Pat. No. 7,767,366.

(30) Foreign Application Priority Data

Mar. 10, 2006 (JP) .................................. 2006-065800

(51) Int. Cl.
*G03F 1/00* (2006.01)
(52) U.S. Cl. .......................................... 430/5; 430/311
(58) Field of Classification Search ................ 430/5, 311
See application file for complete search history.

(56) References Cited

U.S. PATENT DOCUMENTS

| | | | |
|---|---|---|---|
| 4,707,218 A | 11/1987 | Giammarco et al. | |
| 5,474,864 A | 12/1995 | Isao et al. | |
| 5,482,799 A | 1/1996 | Isao et al. | |
| 5,523,185 A | 6/1996 | Goto | |
| 5,592,317 A | 1/1997 | Fujikawa et al. | |
| 6,037,083 A | 3/2000 | Mitsui | |
| 6,335,124 B1 | 1/2002 | Mitsui et al. | |
| 6,395,433 B1 | 5/2002 | Smith | |
| 6,599,667 B2 | 7/2003 | Yusa et al. | |
| 2001/0006754 A1 | 7/2001 | Okazaki et al. | |
| 2002/0058186 A1 | 5/2002 | Nozawa et al. | |

(Continued)

FOREIGN PATENT DOCUMENTS

EP 1 152 292 A2 11/2001

(Continued)

OTHER PUBLICATIONS

European Search Report issued on Dec. 4, 2009 in European Patent Application No. 07 25 1604.

(Continued)

*Primary Examiner* — Stephen Rosasco
*Assistant Examiner* — Rashid Alam
(74) *Attorney, Agent, or Firm* — Birch, Stewart, Kolasch & Birch, LLP

(57) ABSTRACT

A photomask blank is provided comprising an etch stop film which is disposed on a transparent substrate and is resistant to fluorine dry etching and removable by chlorine dry etching, a light-shielding film disposed on the etch stop film and including at least one layer composed of a transition metal/silicon material, and an antireflective film disposed on the light-shielding film. When the light-shielding film is dry etched to form a pattern, pattern size variation arising from pattern density dependency is reduced, so that a photomask is produced at a high accuracy.

23 Claims, 15 Drawing Sheets

U.S. PATENT DOCUMENTS

| | | |
|---|---|---|
| 2002/0115003 A1 | 8/2002 | Tsukamoto et al. |
| 2003/0077520 A1* | 4/2003 | Smith .............................. 430/5 |
| 2003/0180631 A1* | 9/2003 | Shiota et al. ....................... 430/5 |
| 2004/0072081 A1 | 4/2004 | Coleman et al. |
| 2004/0229136 A1 | 11/2004 | Kaneko et al. |
| 2005/0019674 A1 | 1/2005 | Okubo et al. |
| 2005/0042526 A1 | 2/2005 | Lee et al. |
| 2005/0142463 A1 | 6/2005 | Mitsui et al. |
| 2005/0170263 A1 | 8/2005 | Mitsui et al. |
| 2005/0190450 A1 | 9/2005 | Becker et al. |
| 2006/0051681 A1 | 3/2006 | Taylor |
| 2006/0057469 A1 | 3/2006 | Kureishi et al. |

FOREIGN PATENT DOCUMENTS

| | | |
|---|---|---|
| EP | 1 321 820 A1 | 6/2003 |
| EP | 1 439 418 A2 | 7/2004 |
| EP | 1 832 925 A2 | 9/2007 |
| EP | 1 832 926 A2 | 9/2007 |
| JP | 61-138266 A | 6/1986 |
| JP | 63-85553 A | 4/1988 |
| JP | 1-142637 A | 6/1989 |
| JP | 3-116147 A | 5/1991 |
| JP | 4-75059 A | 3/1992 |
| JP | 4-246649 A | 9/1992 |
| JP | 6-95358 A | 4/1994 |
| JP | 6-95363 A | 4/1994 |
| JP | 7-140635 A | 6/1995 |
| JP | 10-148929 A | 6/1998 |
| JP | 2001-312043 A | 11/2001 |
| JP | 3093632 U | 2/2003 |
| JP | 2003-195479 A | 7/2003 |
| JP | 2003-195483 A | 7/2003 |
| JP | 2005-62571 A | 3/2005 |
| JP | 2006-78807 A | 3/2006 |
| WO | WO 2005/076081 A2 | 8/2005 |

OTHER PUBLICATIONS

European Search Report issued on Nov. 6, 2009 in European Patent Application No. 07251007.

Japanese Office Action issued on Mar. 31, 2010 in related Japanese Patent Application No. 2006-065763.

Office Action in Japanese Application No. 2010-122341 mailed on Sep. 29, 2010.

Japanese Office Action issued on Feb. 16, 2011 in Japanese Patent Application No. 2006-065763.

* cited by examiner

PHOTOMASK BLANK AND PHOTOMASK

CROSS-REFERENCE TO RELATED APPLICATION

This application is a Divisional of application Ser. No. 11/715,346, filed on Mar. 8, 2007 now U.S. Pat. No. 7,767,366, the entire contents of which are hereby incorporated by reference and for which priority is claimed under 35 U.S.C. §120.

Application Ser. No. 11/715,346 claims priority under 35 U.S.C. §119(a) on Patent Application No. 2006-065800 filed in Japan on Mar. 10, 2006, the entire contents of which are hereby incorporated by reference.

TECHNICAL FIELD

This invention relates to photomask blanks from which are produced photomasks for use in the microfabrication of semiconductor integrated circuits, charge coupled devices (CCD), liquid crystal display (LCD) color filters, magnetic heads or the like, and photomasks produced therefrom.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing interlayer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. Since the photolithography carries out reduction projection in actually processing semiconductor substrates, the photomask pattern has a size of about 4 times the actually necessary pattern size, but an accuracy which is not loosened accordingly. The photomask serving as an original is rather required to have an accuracy which is higher than the pattern accuracy following exposure.

Further, in the currently prevailing lithography, a circuit pattern to be written has a size far smaller than the wavelength of light used. If a photomask pattern which is a mere 4-time magnification of the circuit feature is used, a faithful shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method. The lithographic performance is sometimes represented by a maximum resolution. As to the resolution limit, the lithography involved in the photomask processing step is required to have a maximum resolution accuracy which is equal to or greater than the resolution limit necessary for the photolithography used in a semiconductor processing step using a photomask.

A photomask pattern is generally formed by forming a photoresist film on a photomask blank having a light-shielding film on a transparent substrate, writing a pattern using electron beam, and developing to form a resist pattern. Using the resulting resist pattern as an etch mask, the light-shielding film is etched into a light-shielding pattern. In an attempt to miniaturize the light-shielding pattern, if processing is carried out while maintaining the thickness of the resist film at the same level as in the prior art prior to the miniaturization, the ratio of film thickness to pattern, known as aspect ratio, becomes higher. As a result, the resist pattern profile is degraded, preventing effective pattern transfer, and in some cases, there occurs resist pattern collapse or stripping. Therefore, the miniaturization must entail a thickness reduction of resist film.

As to the light-shielding film material which is etched using the resist as an etch mask, on the other hand, a number of materials have been proposed. In practice, chromium compound films are always employed because there are known a number of findings with respect to their etching and the standard process has been established. Typical of such films are light-shielding films composed of chromium compounds necessary for photomask blanks for ArF excimer laser lithography, which include chromium compound films with a thickness of 50 to 77 nm as reported in JP-A 2003-195479, JP-A 2003-195483, and Japanese Patent No. 3093632.

However, oxygen-containing chlorine dry etching which is a common dry etching process for chromium based films such as chromium compound films often has a capability of etching organic films to some extent. If etching is carried out through a thin resist film, accurate transfer of the resist pattern is difficult. It is a task of some difficulty for the resist to have both a high resolution and etch resistance that allows for high accuracy etching. Then, for the purpose of achieving high resolution and high accuracy, the light-shielding film material has to be reviewed so as to find a transition from the approach relying only on the resist performance to the approach of improving the light-shielding film performance as well.

Also, as to light-shielding film materials other than the chromium based materials, a number of studies have been made. One example of the latest studies is the use of tantalum in the light-shielding film for ArF excimer laser lithography. See JP-A 2001-312043.

On the other hand, it has long been a common practice to use a hard mask for reducing the load on resist during dry etching. For example, JP-A 63-85553 discloses $MoSi_2$ overlaid with a $SiO_2$ film, which is used as an etch mask during dry etching of $MoSi_2$ with chlorine gas. It is described that the $SiO_2$ film can also function as an antireflective film.

From the past, studies have been made on metal silicide films which can be more readily etched under fluorine dry etching conditions that cause least damages to the resist film, especially molybdenum silicide films. They are disclosed, for example, in JP-A 63-85553, JP-A 1-142637, and JP-A 3-116147, all of which basically use a film of silicon and molybdenum=2:1. Also, JP-A 4-246649 discloses a metal silicide film, which has not been applied to the actual fabrication because of some practical problems. The actual fabrication process accommodates the miniaturization demand by improving conventional chromium-based light-shielding films.

For masks utilizing the ultra-resolution technology such as halftone phase shift masks and Levenson phase shift masks, on the other hand, the mask processing process includes the step of removing a portion of the light-shielding film which causes a phase shift to light, during which step selective etching must be possible between the light-shielding film and the underlying film or substrate. Since conventional chromium-based materials are superior in this sense, few studies have been made on the use of other materials.

DISCLOSURE OF THE INVENTION

The inventors continued efforts to develop a material and method for forming a finer mask pattern at a higher accuracy. Most of our experiments used chromium-based materials commonly employed in the prior art, and selected dry etching conditions containing chlorine and oxygen in transferring a resist pattern to a chromium-based material film. In this method, a photoresist is first coated onto a photomask blank having a light-shielding film of chromium-based material. The resist film is subjected to electron beam exposure and subsequent development, for example, for thereby forming a resist pattern. Using the resist film as an etching mask, the chromium-based material film is etched for transferring the resist pattern to the chromium-based material film.

In this method, however, when the pattern width becomes finer, for example, when a resist pattern of straight lines of up to 0.4 μm wide as a pattern model is transferred to a chromium light-shielding film, a significant pattern density dependency is observed. In some cases, the resulting pattern has noticeable errors relative to the resist pattern formed on the photomask blank. That is, an isolated line with less film pattern left therearound and an isolated space with more film pattern left therearound have a significant difference in resist pattern transfer characteristics so that it is very difficult to make a high accuracy mask.

This problem is not serious when resist pattern features of more than 0.4 μm are used. In the manufacture of a photomask, the problem is not so serious if the photomask is intended for the exposure of a resist pattern of the order of 0.3 μm, but becomes serious if the photomask is to form resist pattern features of 0.1 μm or less.

The above problem might be overcome by avoiding the use of chromium-based material in the light-shielding film. In the prior art, particularly when a light-shielding film of chromium-based material is used in processing a phase shift pattern, the phase shift pattern is precisely transferred to the phase shift film or substrate using the patterned light-shielding film of chromium-based material as a hard mask. After this processing, the unnecessary light-shielding film can be etched away without causing damages to the phase shift film or substrate. In constructing a photomask blank from a new light-shielding film, a new issue arises how to acquire the hard mask function.

An object of the invention is to provide a photomask blank which endows a photomask with both a high resolution and a high accuracy etching capability for forming a finer photomask pattern, especially as needed in the photolithography involving exposure to light of a wavelength equal to or less than 250 nm such as ArF excimer laser light, i.e., a photomask blank having a sufficient process accuracy of etch processing to form a pattern with minimized pattern density dependency, or even a photomask blank having a minimized possibility of causing damages to a phase shift film and a transparent substrate below the light-shielding film during removal of the light-shielding film and a processing accuracy substantially equivalent to that attainable with the prior art light-shielding films of chromium-based material; and a photomask obtained by patterning the photomask blank.

Regarding the accuracy of etch processing to a pattern with a size equal to or less than 0.4 μm, the inventors have found the following. Even a film of chromium-based material can be reduced in pattern density dependency if it is made fully thin, but a chromium-based material film within such thickness range is short in light shielding. As compared with the dry etching of chromium-based materials under chlorine and oxygen-containing conditions, a film which can be processed by fluorine dry etching exhibits reduced pattern density dependency during fluorine dry etching, so that the film can be precision processed even at a sufficient thickness to serve as a light-shielding film. A film containing a transition metal and silicon is appropriate to this end.

Even a film of chromium-based material has reduced pattern density dependency if it is fully thin. Then the chromium-based material film can be utilized in precision processing of patterns if the film has a minimum thickness so that it has no impact on optical properties (e.g., transmittance) of a pattern formed on a photomask.

On the basis of these findings, the inventors have found the following. A light-shielding film consists of a single layer composed of a material containing a transition metal and silicon or multiple layers including at least one layer composed of a material containing a transition metal and silicon; an etch stop film is disposed on a transparent substrate, optionally with another film intervening therebetween, and particularly when a phase shift film is to be used, the phase shift film intervening therebetween, the etch stop film of single layer or multilayer construction being resistant to fluorine dry etching and removable by chlorine dry etching, preferably the etch stop film being composed of chromium alone or a chromium compound containing a transition metal and at least one element of oxygen, nitrogen and carbon; the light-shielding film is disposed contiguous to the etch stop film; and an antireflective film consisting of a single layer or multiple layers is disposed on the light-shielding film. The lamination of films as above results in a photomask blank having the advantages that the light-shielding film can be processed at a high accuracy independent of the pattern density, the light-shielding film can be removed without causing damages to the transparent substrate and phase shift film, and even when the phase shift film and transparent substrate are processed by etching after formation of a pattern of the light-shielding film, a pattern can be transferred to the phase shift film and transparent substrate at a high accuracy.

Accordingly, the present invention provides a photomask blank and a photomask as defined below.

[1] A photomask blank from which is produced a photomask comprising a transparent substrate and a mask pattern formed thereon including transparent regions and effectively opaque regions to exposure light, said photomask blank comprising a transparent substrate, an etch stop film disposed on the substrate, optionally with another film intervening therebetween, said etch stop film of single layer or multilayer construction being resistant to fluorine dry etching and removable by chlorine dry etching, a light-shielding film disposed contiguous to said etch stop film and consisting of a single layer composed of a material containing a transition metal and silicon or multiple layers including at least one layer composed of a material containing a transition metal and silicon, and an antireflective film disposed contiguous to said light-shielding film and consisting of a single layer or multiple layers.

[2] The photomask blank of [1], wherein said etch stop film is composed of chromium alone or a chromium compound containing chromium and at least one element selected from oxygen, nitrogen and carbon.

[3] The photomask blank of [1], wherein said etch stop film is composed of tantalum alone or a tantalum compound containing tantalum and free of silicon.

[4] The photomask blank of any one of [1] to [3], wherein said etch stop film has a thickness of 2 to 20 nm.

[5] The photomask blank of any one of [1] to [4], wherein the material of which the layer of said light-shielding film is composed contains a transition metal and silicon in a ratio of 1:4-15.

[6] The photomask blank of any one of [1] to [5], wherein the material of which the layer of said light-shielding film is composed is an alloy of a transition metal with silicon or a transition metal silicon compound containing a transition metal, silicon and at least one element selected from oxygen, nitrogen and carbon.

[7] The photomask blank of any one of [1] to [5], wherein the material of which the layer of said light-shielding film is composed is a transition metal silicon compound containing a transition metal, silicon and nitrogen.

[8] The photomask blank of [7], wherein said light-shielding film has a nitrogen content of 5 atom % to 40 atom %.

[9] The photomask blank of any one of [1] to [8], wherein said light-shielding film consists of multiple layers including a layer composed of a chromium compound containing chromium and at least one element selected from oxygen, nitrogen and carbon.

[10] The photomask blank of any one of [1] to [9], wherein said light-shielding film consists of two layers, a first light-shielding layer formed adjacent to the transparent substrate and a second light-shielding layer formed adjacent to the antireflective film, the first light-shielding layer is composed of a transition metal silicon compound containing a transition metal, silicon and oxygen and/or nitrogen, and the second light-shielding layer is composed of a chromium compound containing chromium and oxygen and/or nitrogen.

[11] The photomask blank of any one of [1] to [10], wherein said light-shielding film consists of multiple layers, among which a layer disposed contiguous to said antireflective film has an extinction coefficient k of at least 1.5 relative to exposure light.

[12] The photomask blank of any one of [1] to [11], wherein said light-shielding film has a thickness of 10 to 80 nm.

[13] The photomask blank of any one of [1] to [12], wherein said antireflective film includes a layer of a transition metal silicon compound containing a transition metal, silicon, and oxygen and/or nitrogen.

[14] The photomask blank of any one of [1] to [13], wherein said antireflective film includes a layer of chromium alone or a chromium compound containing chromium and oxygen and/or nitrogen.

[15] The photomask blank of any one of [1] to [14], wherein said antireflective film consists of two layers, a first antireflective layer formed adjacent to the transparent substrate and a second antireflective layer formed remote from the transparent substrate, the first antireflective layer is composed of a transition metal silicon compound comprising a transition metal, silicon and oxygen and/or nitrogen, and the second antireflective layer is composed of a chromium compound containing chromium and oxygen and/or nitrogen.

[16] The photomask blank of [14] or [15], wherein in said antireflective film, the layer of chromium compound has a chromium content of at least 50 atom %.

[17] The photomask blank of any one of [1] to [16], further comprising an etching mask film disposed contiguous to said antireflective film and consisting of a single layer or multiple layers which are resistant to fluorine dry etching and removable by chlorine dry etching.

[18] The photomask blank of [17], wherein said etching mask film is composed of chromium alone or a chromium compound containing chromium and at least one element selected from oxygen, nitrogen and carbon.

[19] The photomask blank of [17] or [18], wherein said etching mask film has a thickness of 2 to 30 nm.

[20] The photomask blank of any one of [1] to [19], wherein said transition metal is at least one element selected from the group consisting of titanium, vanadium, cobalt, nickel, zirconium, niobium, molybdenum, hafnium, tantalum, and tungsten.

[21] The photomask blank of any one of [1] to [19], wherein said transition metal is molybdenum.

[22] The photomask blank of any one of [1] to [21], wherein a phase shift film intervenes as the other film.

[23] The photomask blank of [22], wherein said phase shift film is a halftone phase shift film.

[24] A photomask obtained by patterning the photomask blank of any one of [1] to [23].

BENEFITS OF THE INVENTION

As compared with photomask blanks having conventional light-shielding films of chromium-based materials, the photomask blank of the invention has the advantage that when the light-shielding film is dry etched to form a pattern, the variation of pattern feature size arising from the pattern density dependency is reduced. This enables to produce a mask at a high accuracy. When the photomask blank of the invention is applied to a halftone phase shift mask, chromeless mask or Levenson mask, the light-shielding film can be selectively removed by dry etching without causing damages to any film underlying the light-shielding film and transparent substrate, enabling phase control at a high accuracy. Then photomasks for super-resolution exposure can be manufactured at a high accuracy.

Figure 5A:
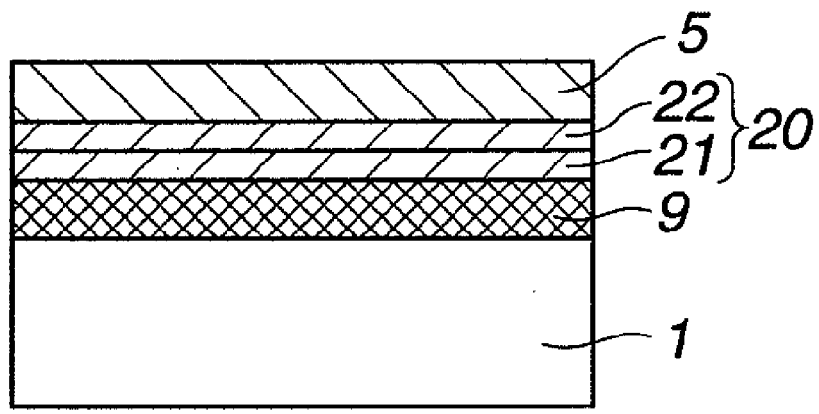
FIG. 5 is a cross-sectional view showing one exemplary photomask blank in a fifth embodiment of the invention, FIG.
Figure 5B:
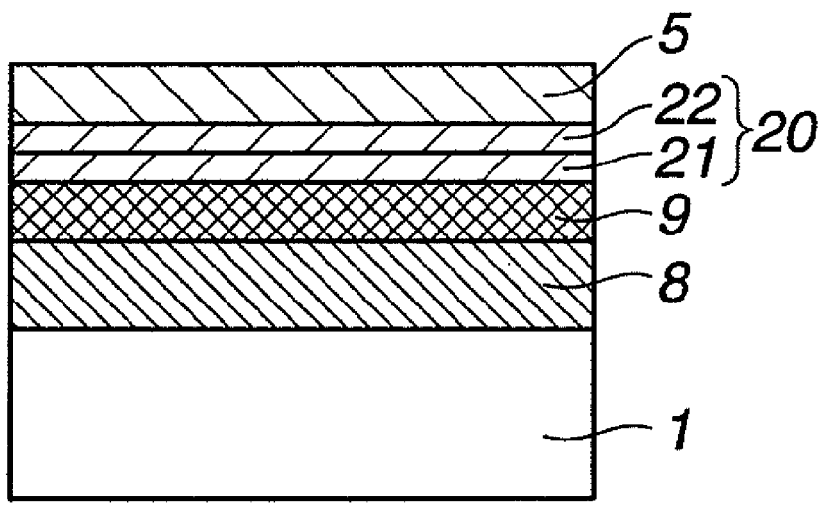

5A corresponding to a light-shielding film disposed directly on a transparent substrate and FIG. 5B corresponding to a light-shielding film disposed on a transparent substrate via a phase shift film.

FIG. 6 schematically illustrates steps of a method for producing a photomask according to the invention, the method using the photomask blank of the first embodiment and producing a Levenson mask (photomask producing procedure A).

FIG. 7 schematically illustrates steps of a method for producing a photomask according to the invention, the method using the photomask blank of the first embodiment and producing a tritone phase shift mask (photomask producing procedure B).

FIG. 8 schematically illustrates steps of a method for producing a photomask according to the invention, the method using the photomask blank of the second embodiment and producing a Levenson mask (photomask producing procedure C).

FIG. 9 schematically illustrates steps of a method for producing a photomask according to the invention, the method using the photomask blank of the second embodiment and producing a zebra-type chromeless mask (photomask producing procedure D), FIGS. 9A, 9C, 9E, 9G and 9I being cross-sectional views and FIGS. 9B, 9D, 9F, 9H and 9J being plan views.

FIG. 10 schematically illustrates steps of a method for producing a photomask according to the invention, i.e., subsequent steps from FIG. 9 of the method using the photomask blank of the second embodiment and producing a zebra-type chromeless mask (photomask producing procedure D), FIGS. 10A, 10C, 10E, 10G and 10I being cross-sectional views and FIGS. 10B, 10D, 10F, 10H and 10J being plan views.

FIG. 11 schematically illustrates steps of a method for producing a photomask according to the invention, the method using the photomask blank of the second embodiment and producing a tritone phase shift mask (photomask producing procedure E).

FIG. 12 schematically illustrates steps of a method for producing a photomask according to the invention, the method using the photomask blank of the third embodiment and producing a Levenson mask (photomask producing procedure F).

FIG. 13 schematically illustrates steps of a method for producing a photomask according to the invention, the method using the photomask blank of the third embodiment and producing a tritone phase shift mask (photomask producing procedure G).

FIG. 14 schematically illustrates steps of a method for producing a photomask according to the invention, the method using the photomask blank of the fourth embodiment and producing a halftone phase shift mask (photomask producing procedure H).

FIG. 15 schematically illustrates steps of a method for producing a photomask according to the invention, the method using the photomask blank of the fifth embodiment and producing a halftone phase shift mask (photomask producing procedure I).

Figure 16:
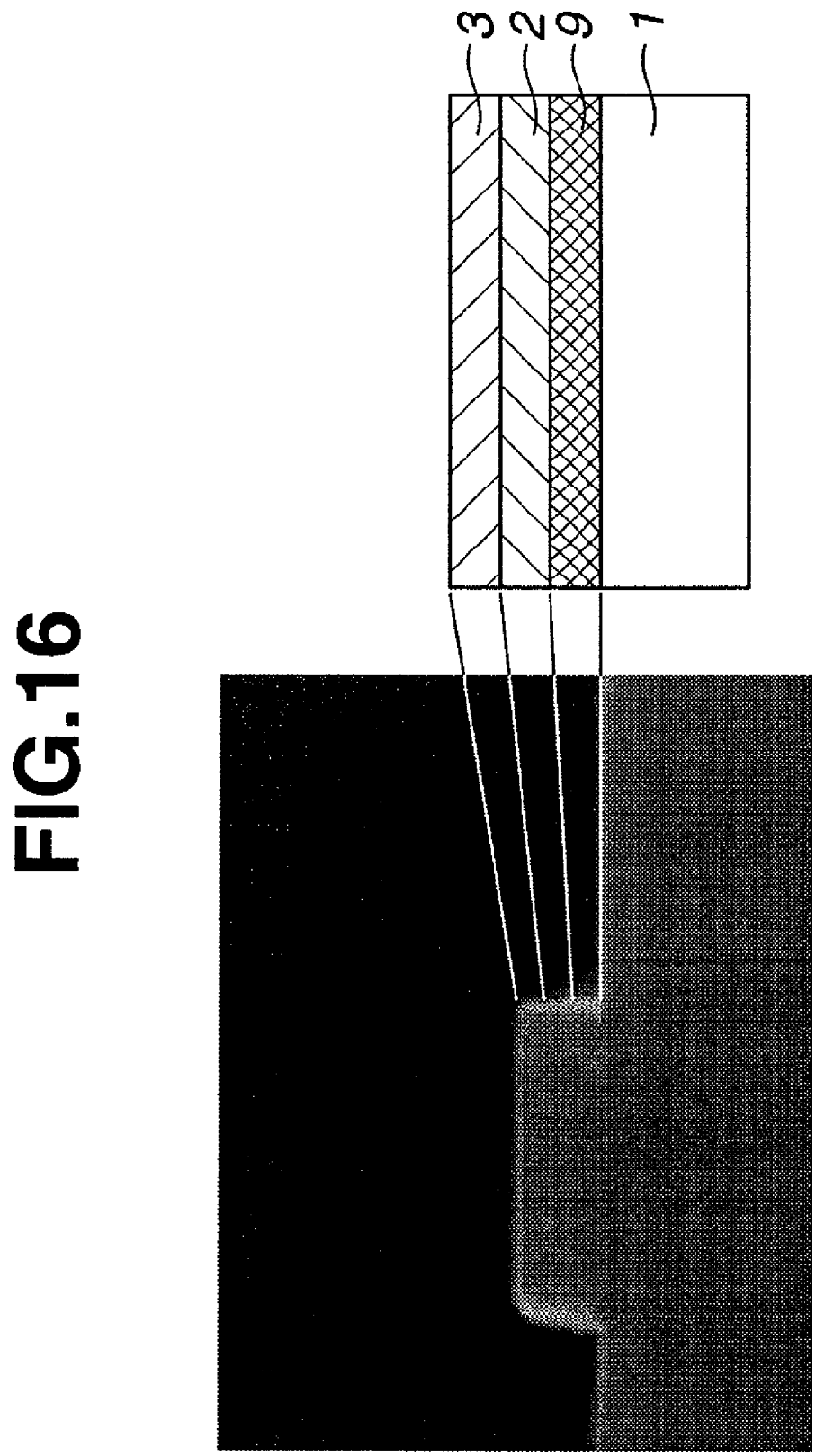

FIG. 16 is a photomicrograph in cross section of an intermediate sample having an antireflective film, light-shielding film and etch stop film patterned during the production of a Levenson mask in Example 2, showing its light-shielding pattern, and a schematic cross-sectional view of the intermediate sample.

Figure 17:
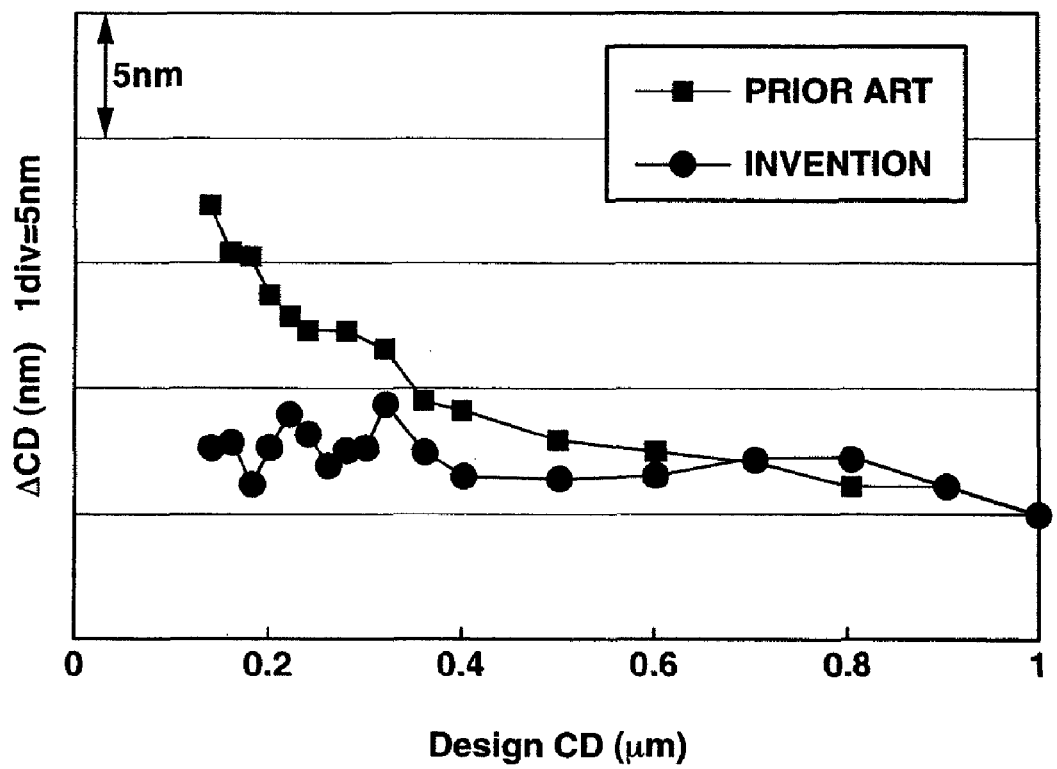

FIG. 17 is a graph showing the results of a CD linearity test of photomask blanks of Example 4 and Comparative Example.

Figure 18:
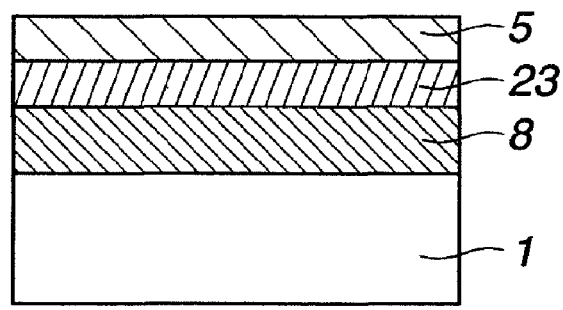

FIG. 18 is a schematic cross-sectional view of a photomask blank in Comparative Example.

DESCRIPTION OF THE PREFERRED EMBODIMENTS

As used in connection with dry etching, the term "susceptible" means that the material can be etched by dry etching, and the term "resistant" means that the material withstands dry etching. As used herein, the term "fluorine dry etching" refers to dry etching using an etchant gas containing fluorine, and the term "chlorine dry etching" refers to dry etching using an etchant gas containing chlorine and optionally oxygen.

The present invention is directed to a photomask blank from which a photomask comprising a transparent substrate and a mask pattern formed thereon including transparent regions and effectively opaque regions to exposure light is produced. The photomask blank comprises a transparent substrate, an etch stop film disposed on the substrate, optionally with another film intervening therebetween, the etch stop film of single layer or multilayer construction being resistant to fluorine dry etching and removable by chlorine dry etching, a light-shielding film disposed contiguous to the etch stop film and consisting of a single layer composed of a material containing a transition metal and silicon or multiple layers including at least one layer composed of a material containing a transition metal and silicon, and an antireflective film disposed contiguous to the light-shielding film and consisting of a single layer or multiple layers.

The etch stop film is a film serving for a function of preventing the other film underlying the light-shielding film, typically phase shift film, and the transparent substrate from being etched during fluorine dry etching of the light-shielding film; the light-shielding film is a film serving predominantly for a shielding function to exposure light; and the antireflective film (ARF) is a film serving predominantly for an antireflection function to exposure light or inspection light, that is, a function of reducing reflectance, on use in photomask form.

A light-shielding film containing a transition metal and silicon is used because of the inventors' discovery described below.

Aiming at photomasks for use in semiconductor lithography with a pattern rule equal to or less than 0.1 μm, the inventors have investigated a photomask blank capable of being processed to a fine size and at a high accuracy and a method of producing a photomask therefrom. As the pattern size of a light-shielding film formed on a photomask becomes smaller, the absolute value of errors involved in mask processing must be smaller. In some cases, however, errors become rather large due to the influence of pattern size.

A chromium-based light-shielding film used in the prior art is processed by a standard technique of oxygen-containing chlorine dry etching while using a resist pattern as an etching mask. Problems arising during the processing are not so serious when the pattern size exceeds 0.4 μm. On the other hand, masks for use in ArF excimer laser exposure must have a very high accuracy if the light-shielding film has a pattern size equal to or less than 0.4 μm (which corresponds to a pattern design rule of 0.1 μm because of one-fourth reduction projection).

An attempt to transfer a pattern with a size equal to or less than 0.4 μm to a chromium-based light-shielding film has revealed the enhancement of pattern density dependency in that in processing a photomask blank into a photomask, the transfer characteristics associated with the resist pattern largely differ between an area where patterns are isolated (isolated pattern area) and an area where spaces (the film is absent) are isolated (isolated space area). It is expected that this problem is exaggerated when the size of a pattern to be transferred is further reduced to 0.2 µm or less, imposing substantial impact on the formation of OPC patterns or the like.

Specifically, as a typical photomask blank model for an ArF lithography mask, there was furnished a photomask blank comprising a CrN light-shielding film of 26 nm thick (Cr:N=9:1 in atomic ratio) and a CrON antireflective film of 20 nm thick (Cr:O:N=4:5:1 in atomic ratio) deposited in sequence on a transparent substrate. On this photomask blank, a 1:9 line-and-space pattern (isolated pattern model) and a 9:1 line-and-space pattern (isolated space model) were formed as an isolated/grouped line pattern model having a line width varying from 1.6 µm to 0.2 µm at intervals of 0.1 µm, by chlorine and oxygen dry etching under etching conditions: a $Cl_2$ flow rate of 20 sccm, an $O_2$ flow rate of 9 sccm, a He flow rate of 80 sccm, and a chamber internal pressure of 2 Pa. As a result, in the isolated space, the size error over the range from 1.6 µm to 0.2 µm amounted to 5.3 nm in terms of the difference between minimum and maximum widths. In the isolated pattern, the width was 3.8 nm in the range from 1.6 µm to 0.5 µm, but 13.8 nm in the range from 1.6 µm to 0.2 µm. A phenomenon was observed that the etching rate substantially differs (finished thick) among fine isolated patterns equal to or less than 0.4 µm.

Under the expectation that the line density dependency is closely correlated to etching conditions, a test was carried out on a transition metal silicide light-shielding film as the light-shielding film which can be processed under different etching conditions. As a photomask blank model for an ArF lithography mask, there was furnished a photomask blank comprising a MoSiN light-shielding film of 23 nm thick (Mo:Si:N=1:3:1.5 in atomic ratio) and a MoSiN antireflective film of 18 nm thick (compositionally graded in a thickness direction from Mo:Si:N=1:3:1.5 in atomic ratio on the light-shielding film side to Mo:Si:N=1:5:5 in atomic ratio on the side remote from the transparent substrate) deposited in sequence on a transparent substrate. On this photomask blank, a 1:9 line-and-space pattern (isolated pattern model) and a 9:1 line-and-space pattern (isolated space model) were formed as an isolated/grouped line pattern model having a line width varying from 1.6 µm to 0.2 µm at intervals of 0.1 µm, by fluorine dry etching under conditions: $C_2F_6$ at 20 sccm and chamber internal pressure 2 Pa. As a result, in the isolated space, the size error over the range from 1.6 µm to 0.2 µm amounted to 2.3 nm in terms of the difference between minimum and maximum widths. In the isolated pattern, the width was 9.0 nm in the range from 1.6 µm to 0.2 µm, indicating that the problem of line density dependency is significantly ameliorated.

While all currently used super-resolution photomasks including halftone phase shift masks, chromeless masks and Levenson masks are designed to increase the light contrast in lithography by utilizing the interference effect of phase different light, the phase of light transmitted by the mask is controlled by the material and film thickness of a phase shifter formed on the mask. In the manufacture of super-resolution photomasks utilizing the phase shift effect as currently widely employed, a pattern of phase shifter is formed by a method involving providing a photomask blank having a light-shielding film deposited thereon, first patterning the light-shielding film formed on the phase shift film, then transferring the pattern to the phase shift film. Therefore, it is very important that the pattern of the light-shielding film be accurately defined.

The importance is not limited to this point. Before a phase shifter is completed, the light-shielding film on the phase shift film and the transparent substrate must be removed to allow for incidence of light to the phase shifter. If the phase shift film and transparent substrate are damaged during removal of the light-shielding film, then errors are introduced into the phase difference created by the phase shifter. It is thus important that the light-shielding film be removed without causing damages to any film underlying the light-shielding film such as the phase shift film and the transparent substrate.

The ordinary phase shifter used in the phase shift mask is a film composed of transition metal silicide having oxygen and/or nitrogen added thereto in the case of halftone phase shift masks, or the transparent substrate itself or a layer structure of silicon oxide or the like in the case of chromeless masks and Levenson masks. In either case, they are materials which are processed by fluorine dry etching. Then, the light-shielding film materials used in the prior art are chromium-based materials. The chromium-based materials have been advantageous for the light-shielding film because they are resistant to fluorine dry etching conditions, perform well as an etching mask during fluorine dry etching, and can be removed under chlorine-containing dry etching conditions that do not attack the silicon-containing materials, for example, chlorine dry etching as typified by dry etching using an etchant gas containing chlorine and oxygen.

On the other hand, the problem that the accuracy of processing of conventional chromium-based light-shielding film materials lowers due to the pattern density dependency becomes quite serious in the manufacture of a photomask intended for exposure of a pattern with a feature size equal to or less than 0.1 µm. The photomask blank of the invention solves the problem of processing accuracy by using a material containing a transition metal and silicon, which is susceptible to fluorine dry etching, in at least a portion, preferably the entirety of a light-shielding film, and establishes an etching selectivity relative to any film underlying the light-shielding film such as the phase shift film and the substrate, using an etch stop film of a single layer or multilayer structure.

Accordingly, the etch stop film used herein must be a film which is resistant to fluorine dry etching and removable by dry etching under chlorine-containing conditions that are etching conditions causing no damages to the phase shift film and transparent substrate. The preferred materials having such functions include chromium-based materials and materials containing tantalum, free of silicon.

The preferred chromium-based materials include chromium alone and chromium compounds containing chromium and at least one element selected from oxygen, nitrogen and carbon and more preferably free of silicon. More illustrative examples of the chromium compound include chromium oxide, chromium nitride, chromium oxynitride, chromium oxycarbide, chromium nitride carbide, and chromium oxide nitride carbide.

The chromium-based materials are highly resistant to fluorine dry etching and at the same time, etchable under dry etching conditions containing chlorine and oxygen. Since the chromium-based materials can be removed by dry etching under such conditions without causing damage to the material containing a transition metal, silicon, and oxygen and/or nitrogen used in a phase shift film, typically a halftone phase shift film, or the silicon oxide material disposed beneath the light-shielding film in the case of a chromeless mask or Levenson mask, they function well as an etch stop film for solving the outstanding problems.

On the other hand, the tantalum-containing material loses resistance to fluorine dry etching if it contains silicon. However, in the absence of silicon, a tantalum-containing material, for example, tantalum alone has a sufficient resistance to fluorine dry etching to allow for selective etching relative to the silicon-containing material. Also, tantalum compounds containing tantalum, free of silicon, such as materials based on tantalum and zirconium, or tantalum and hafnium offer a satisfactory etching selectivity ratio relative to the silicon-containing material. It is noted that unlike the chromium-based materials, the tantalum-containing materials can be etched by oxygen-free chlorine dry etching.

Depending on the design of a mask to be produced, the etch stop film used herein is deposited on a transparent substrate directly or via a halftone phase shift film, a transparent phase shift film or the like (while another etch stop film may intervene between the transparent substrate and the phase shift film).

The etch stop film should preferably have a thickness of at least 2 nm, more preferably at least 5 nm. Then the etch stop film exerts its function so that any film underlying the etch stop film or substrate may not be damaged when a light-shielding film containing a transition metal and silicon is etched. The upper limit of the etch stop film thickness is generally up to 20 nm, preferably up to 15 nm.

As will be described later, in some cases, depending on the type of a photomask to be produced, the etch stop film is used as an etching mask in order to etch the underlying film or substrate at a high accuracy in a position selective fashion. In such cases, the etch stop film may be thicker if necessary, for example, a thickness of 2 to 55 nm. The inventors have found that if the etch stop film is too thick, there is a possibility that when the film is etched under chlorine and oxygen-containing conditions, substantial side etching occurs, rather resulting in a lowering of size accuracy during subsequent processing of the underlying film. To avoid the problem of side etching, the etch stop film should preferably have a thickness of not more than 55 nm, more preferably not more than 40 nm, and even more preferably not more than 30 nm. The same problem arises when a chromium-based material is used as part of the etching mask film or light-shielding film to be described later, and the above-described thickness range is preferred for higher accuracy size control.

For the etch stop film of chromium-based material, when the etch stop film functions as an etching mask as described above, it should preferably be constructed from multiple layers, for example, two or three layers, at least one of which is composed of chromium alone or a chromium compound containing chromium and at least one of oxygen, nitrogen and carbon, with a chromium content of at least 50 atom %. Then the etch stop film can exert an etching mask function without a need to increase its thickness.

The etch stop film can be deposited by well-known methods. Among others, the sputtering process is preferable. The sputtering process may be either DC sputtering, RF sputtering or the like.

Deposition of the etch stop film may be performed by a method as used in the prior art for chromium-based light-shielding films and antireflective films. One commonly used method is by sputtering a chromium or tantalum target in an inert gas such as argon, a reactive gas such as oxygen-containing gas, nitrogen-containing gas or carbon-containing gas, or a mixture of an inert gas and a reactive gas. See JP-A 7-140635, for example.

When the etch stop film used herein is composed of a chromium-based material and has less adhesion to any component disposed contiguous thereto such as a light-shielding film, phase shift film or substrate so that pattern defects may frequently occur, the etch stop film, if it is a single layer, is preferably constructed as a single layer whose composition is continuously graded in a thickness direction so that one or both of the side surface contiguous to the transparent substrate or the other film disposed between the transparent substrate and the light-shielding film and the side surface contiguous to the light-shielding film are composed of a chromium compound containing oxygen and/or nitrogen.

If the etch stop film is a multilayer film, on the other hand, the etch stop film is preferably constructed from multiple layers whose composition is graded stepwise in a thickness direction so that one or both of the layer contiguous to the transparent substrate or the other film disposed between the transparent substrate and the light-shielding film and the layer contiguous to the light-shielding film are composed of a chromium compound containing oxygen and/or nitrogen. The construction of the etch stop film in this way improves the adhesion. The etch stop film of the above construction can be readily formed by controlling the parameters of reactive sputtering.

Described below are the light-shielding film and antireflective film deposited on the etch stop film.

In the photomask blank of the invention, the light-shielding film is constructed by a single layer composed of a material containing a transition metal and silicon or multiple layers including at least one layer composed of a material containing a transition metal and silicon. On the other hand, the antireflective film is constructed by a single layer or multiple layers. The light-shielding film and the antireflective film are preferably constructed such that the light-shielding film and antireflective film can be processed by a single dry etching step or two dry etching steps in order to avoid complication of etch processing steps beyond the necessity.

Figure 1A:
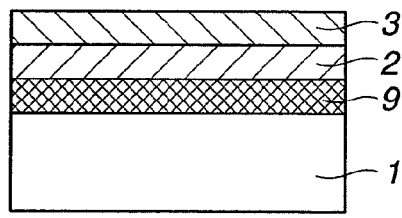
FIG. 1 is a cross-sectional view showing one exemplary photomask blank in a first embodiment of the invention, FIG. 1A corresponding to a light-shielding film disposed directly on a transparent substrate and FIG. 1B corresponding to a light-shielding film disposed on a transparent substrate via a phase shift film.
Figure 1B:
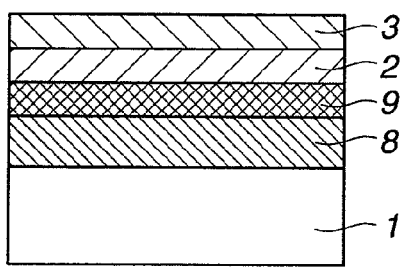

The construction allowing the light-shielding film and antireflective film to be processed by a single dry etching step includes the construction wherein the light-shielding film and antireflective film are entirely composed of materials containing a transition metal and silicon which are susceptible to fluorine dry etching (the first embodiment). Specifically, one exemplary blank is illustrated in FIG. 1A as comprising an etch stop film 9, a light-shielding film 2 and an antireflective film 3 disposed on a transparent substrate 1 in the described sequence. The blank having a light-shielding film disposed on a transparent substrate via another intervening film includes a blank having a phase shift film intervening as the other film between laminated films. Specifically, one exemplary blank is illustrated in FIG. 1B as comprising a phase shift film 8, an etch stop film 9, a light-shielding film 2 and an antireflective film 3 disposed on a transparent substrate 1 in the described sequence.

Figure 2A:
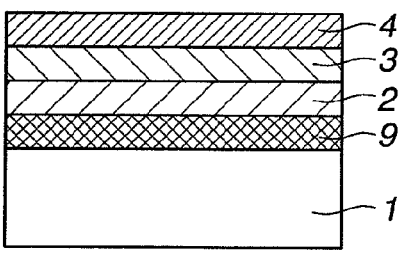
FIG. 2 is a cross-sectional view showing one exemplary photomask blank in a second embodiment of the invention, FIG. 2A corresponding to a light-shielding film disposed directly on a transparent substrate and FIG. 2B corresponding to a light-shielding film disposed on a transparent substrate via a phase shift film.
Figure 2B:
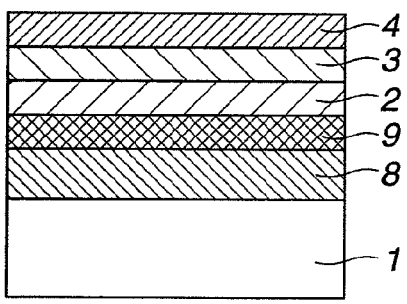

The blank may also be constructed so as to include on the antireflective film an etching mask film composed of a material which is resistant to fluorine dry etching (the second embodiment). Specifically, one exemplary blank is illustrated in FIG. 2A as comprising an etch stop film 9, a light-shielding film 2, an antireflective film 3 and an etching mask film 4 disposed on a transparent substrate 1 in the described sequence. The blank having a light-shielding film disposed on a transparent substrate via another intervening film includes a blank having a phase shift film intervening as the other film between laminated films. Specifically, one exemplary blank is illustrated in FIG. 2B as comprising a phase shift film 8, an etch stop film 9, a light-shielding film 2, an antireflective film 3 and etching mask film 4 disposed on a transparent substrate 1 in the described sequence.

The effect of ameliorating the problem of pattern density dependency arising in forming a pattern with a feature size equal to or less than 0.4 μm becomes most outstanding with these first and second embodiments.

Figure 3A:
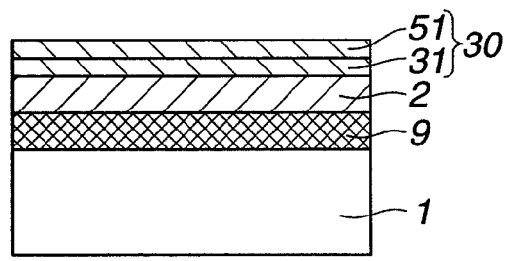
FIG. 3 is a cross-sectional view showing one exemplary photomask blank in a third embodiment of the invention, FIG. 3A corresponding to a light-shielding film disposed directly on a transparent substrate and FIG. 3B corresponding to a light-shielding film disposed on a transparent substrate via a phase shift film.
Figure 3B:
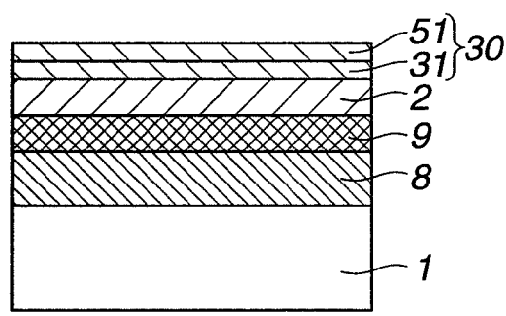

The construction allowing the light-shielding film and antireflective film to be processed by two dry etching steps includes the construction wherein the light-shielding film is composed of a material containing a transition metal and silicon which is susceptible to fluorine dry etching and the antireflective film includes a layer, disposed adjacent to the light-shielding film, composed of a material susceptible to fluorine dry etching and a layer, disposed remote from the light-shielding film, composed of a material resistant to fluorine dry etching (the third embodiment). Specifically, one exemplary blank is illustrated in FIG. 3A as comprising an etch stop film 9, a light-shielding film 2 susceptible to fluorine dry etching, and an antireflective film 30 consisting of two layers: an antireflective layer 31 susceptible to fluorine dry etching (first antireflective layer) and an antireflective layer 51 resistant to fluorine dry etching (second antireflective layer), disposed on a transparent substrate 1 in the described sequence. The blank having a light-shielding film disposed on a transparent substrate via another intervening film includes a blank having a phase shift film intervening as the other film between laminated films. Specifically, one exemplary blank is illustrated in FIG. 3B as comprising a phase shift film 8, an etch stop film 9, a light-shielding film 2 susceptible to fluorine dry etching, and an antireflective film 30 consisting of two layers: an antireflective layer 31 susceptible to fluorine dry etching (first antireflective layer) and an antireflective layer 51 resistant to fluorine dry etching (second antireflective layer), disposed on a transparent substrate 1 in the described sequence.

Figure 4A:
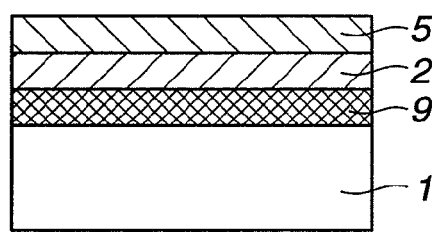
FIG. 4 is a cross-sectional view showing one exemplary photomask blank in a fourth embodiment of the invention, FIG. 4A corresponding to a light-shielding film disposed directly on a transparent substrate and FIG. 4B corresponding to a light-shielding film disposed on a transparent substrate via a phase shift film.
Figure 4B:
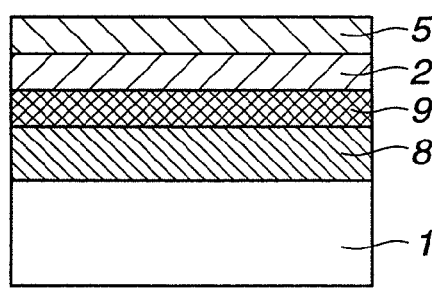

Also included is the construction wherein the light-shielding film is composed of a material containing a transition metal and silicon which is susceptible to fluorine dry etching and the antireflective film is composed of a material which is resistant to fluorine dry etching (the fourth embodiment). Specifically, one exemplary blank is illustrated in FIG. 4A as comprising an etch stop film 9, a light-shielding film 2 susceptible to fluorine dry etching, and an antireflective film 5 resistant to fluorine dry etching, disposed on a transparent substrate 1 in the described sequence. The blank having a light-shielding film disposed on a transparent substrate via another intervening film includes a blank having a phase shift film intervening as the other film between laminated films. Specifically, one exemplary blank is illustrated in FIG. 4B as comprising a phase shift film 8, an etch stop film 9, a light-shielding film 2 susceptible to fluorine dry etching, and an antireflective film 5 resistant to fluorine dry etching, disposed on a transparent substrate 1 in the described sequence.

Also included is the construction wherein the light-shielding film includes a layer, disposed adjacent to the transparent substrate, composed of a material containing a transition metal and silicon which is susceptible to fluorine dry etching and a layer, disposed adjacent to the antireflective film, composed of a material which is resistant to fluorine dry etching and the antireflective film is composed of a material which is resistant to fluorine dry etching (the fifth embodiment). Specifically, one exemplary blank is illustrated in FIG. 5A as comprising an etch stop film 9, a light-shielding film 20 consisting of two layers: a light-shielding layer 21 susceptible to fluorine dry etching (first light-shielding layer) and a light-shielding layer 22 resistant to fluorine dry etching (second light-shielding layer), and an antireflective film 5 resistant to fluorine dry etching, disposed on a transparent substrate 1 in the described sequence. The blank having a light-shielding film disposed on a transparent substrate via another intervening film includes a blank having a phase shift film intervening as the other film between laminated films. Specifically, one exemplary blank is illustrated in FIG. 5B as comprising a phase shift film 8, an etch stop film 9, a light-shielding film 20 consisting of two layers: a light-shielding layer 21 susceptible to fluorine dry etching (first light-shielding layer) and a light-shielding layer 22 resistant to fluorine dry etching (second light-shielding layer), and an antireflective film 5 resistant to fluorine dry etching, disposed on a transparent substrate 1 in the described sequence.

It is noted that a film or layer resistant to fluorine dry etching should have a reduced thickness sufficient to avoid the problem of transferred pattern's density dependency during dry etching. Then the etching mask film avoids the problem of pattern density dependency. As compared with prior art photomask blanks using fluorine dry etching resistant materials such as chromium-based materials in the entirety of the light-shielding film and antireflective film, the blank of the invention is successful in apparently minimizing the transferred pattern's density dependency.

More particularly, a film or layer which is resistant to fluorine dry etching of the light-shielding film and antireflective film may function as an etching mask when the light-shielding film containing a transition metal and silicon, a layer of a material containing a transition metal and silicon to constitute the light-shielding film and a layer of a material containing a transition metal and silicon to constitute the antireflective film are etched, and also function as an etching mask when an underlying film such as a phase shift film and the transparent substrate are etched.

The transition metal and silicon-containing materials susceptible to fluorine dry etching used herein to form the light-shielding film and antireflective film include alloys of a transition metal with silicon, and transition metal silicon compounds containing a transition metal, silicon, and at least one element selected from oxygen, nitrogen and carbon, preferably transition metal silicon compounds containing a transition metal, silicon, and oxygen and/or nitrogen. More illustrative examples of the transition metal silicon compound include transition metal silicon oxide, transition metal silicon nitride, transition metal silicon oxynitride, transition metal silicon oxycarbide, transition metal silicon nitride carbide, and transition metal silicon oxide nitride carbide, with the transition metal silicon nitride being most preferred.

The transition metal is preferably at least one element selected from the group consisting of titanium, vanadium, cobalt, nickel, zirconium, niobium, molybdenum, hafnium, tantalum, and tungsten. Inter alia, molybdenum is more preferred for dry etching amenability.

The light-shielding film and the antireflective film each may consist of a single layer or multiple layers or even a single layer with continuous compositional grading in a thickness direction or multiple layers with stepwise compositional grading in a thickness direction.

With respect to the composition of the material containing a transition metal and silicon, the light-shielding film preferably has a composition consisting essentially of 10 atom % to 95 atom %, specifically 30 atom % to 95 atom % of silicon, 0 atom % to 50 atom %, specifically 0 atom % to 30 atom % of oxygen, 0 atom % to 40 atom %, specifically 1 atom % to 20 atom % of nitrogen, 0 atom % to 20 atom %, specifically 0 atom % to 5 atom % of carbon, and 0 atom % to 35 atom %, specifically 1 atom % to 20 atom % of transition metal.

The light-shielding film, when its composition is graded in a thickness direction, preferably has a composition consisting essentially of 10 atom % to 95 atom %, specifically 15 atom % to 95 atom % of silicon, 0 atom % to 60 atom %, specifically 0 atom % to 30 atom % of oxygen, 0 atom % to 57 atom %, specifically 1 atom % to 40 atom % of nitrogen, 0 atom % to 30 atom %, specifically 0 atom % to 20 atom % of carbon, and 0 atom % to 35 atom %, specifically 1 atom % to 20 atom % of transition metal. Better etching characteristics are obtained particularly when the nitrogen content is 1 atom % to 40 atom %.

During etching under chlorine and oxygen-containing etching conditions, for example, etching of the etch stop film, even transition metal and silicon-containing materials can be etched to some extent. If the transition metal and silicon-containing material is a transition metal silicon compound containing a transition metal, silicon and nitrogen, more preferably with a nitrogen content of 1 atom % to 40 atom %, even more preferably 5 atom % to 40 atom %, the light-shielding film and antireflective film of transition metal and silicon-containing materials are prevented from being damaged even when etching conditions with damaging potential are employed. These films allow for a high degree of freedom to processing conditions.

On the other hand, the antireflective film preferably has a composition consisting essentially of 10 atom % to 80 atom %, specifically 30 atom % to 50 atom % of silicon, 0 atom % to 60 atom %, specifically 0 atom % to 40 atom % of oxygen, 0 atom % to 57 atom %, specifically 20 atom % to 50 atom % of nitrogen, 0 atom % to 20 atom %, specifically 0 atom % to 5 atom % of carbon, and 0 atom % to 35 atom %, specifically 1 atom % to 20 atom % of transition metal.

The antireflective film, when its composition is graded in a thickness direction, preferably has a composition consisting essentially of 0 atom % to 90 atom %, specifically 10 atom % to 90 atom % of silicon, 0 atom % to 67 atom %, specifically 5 atom % to 67 atom % of oxygen, 0 atom % to 57 atom %, specifically 5 atom % to 50 atom % of nitrogen, 0 atom % to 20 atom %, specifically 0 atom % to 5 atom % of carbon, and 0 atom % to 95 atom %, specifically 1 atom % to 20 atom % of transition metal.

Further, a choice of compositional ratio of transition metal to silicon in the range from 1:4 to 1:15 (atomic ratio) advantageously enhances the inertness to chemicals used in cleaning and other purposes. Even when the compositional ratio of transition metal to silicon is outside the range, the inclusion of nitrogen, especially to a nitrogen content of 5 atom % to 40 atom %, imparts the chemical inertness required and is effective for alleviating damages during oxygen-containing chlorine dry etching for the etching of a Cr film used as the etching mask film. At this time, the ratio of transition metal to silicon may be in a range from 1:1 to 1:10 (atomic ratio), for example.

The transition metal and silicon-containing material is required to have chemical stability in that its film undergoes little or no thickness change during cleaning. The photomask for ArF lithography is required to have a film thickness change of up to 3 nm during cleaning. It is necessary to avoid the situation that the conditions of cleaning requisite in the photomask production process, especially cleaning with sulfuric acid/aqueous hydrogen peroxide, damage the light-shielding film to deprive it of a light-shielding effect. Also the conductivity of the light-shielding film should be controlled so as to prevent any charge buildup upon exposure of electron beam in the lithographic process for mask pattern formation.

The light-shielding film and antireflective film, when the molar ratio of transition metal to silicon is in the range from 1:4 to 1:15 (atomic ratio), exhibit chemical resistance during rigorous chemical cleaning without a need for optimization of a nitrogen content as well as a conductivity within a practically acceptable range.

The materials which are resistant to fluorine dry etching of the light-shielding film and antireflective film include chromium-based materials, preferably chromium alone or chromium compounds containing chromium and at least one element selected from oxygen, nitrogen and carbon, more preferably chromium compounds containing chromium and oxygen and/or nitrogen, and should preferably be free of silicon. More illustrative examples of the chromium compound include chromium oxide, chromium nitride, chromium oxynitride, chromium oxycarbide, chromium nitride carbide, and chromium oxide nitride carbide.

With respect to the composition of chromium-based material, the light-shielding film preferably has a composition consisting essentially of 50 atom % to 100 atom %, specifically 60 atom % to 100 atom % of chromium, 0 atom % to 50 atom %, specifically 0 atom % to 40 atom % of oxygen, 0 atom % to 50 atom %, specifically 0 atom % to 40 atom % of nitrogen, and 0 atom % to 20 atom %, specifically 0 atom % to 10 atom % of carbon.

The light-shielding film, when its composition is graded in a thickness direction, preferably has a composition consisting essentially of 50 atom % to 100 atom %, specifically 60 atom % to 100 atom % of chromium, 0 atom % to 60 atom %, specifically 0 atom % to 50 atom % of oxygen, 0 atom % to 50 atom %, specifically 0 atom % to 40 atom % of nitrogen, and 0 atom % to 20 atom %, specifically 0 atom % to 10 atom % of carbon.

With respect to the composition of chromium compound, the antireflective film preferably has a composition consisting essentially of 30 atom % to 70 atom %, specifically 35 atom % to 50 atom % of chromium, 0 atom % to 60 atom %, specifically 20 atom % to 60 atom % of oxygen, 0 atom % to 50 atom %, specifically 3 atom % to 30 atom % of nitrogen, and 0 atom % to 20 atom %, specifically 0 atom % to 5 atom % of carbon.

The antireflective film, when its composition is graded in a thickness direction, preferably has a composition consisting essentially of 30 atom % to 100 atom %, specifically 35 atom % to 90 atom % of chromium, 0 atom % to 60 atom %, specifically 3 atom % to 60 atom % of oxygen, 0 atom % to 50 atom %, specifically 3 atom % to 50 atom % of nitrogen, and 0 atom % to 30 atom %, specifically 0 atom % to 20 atom % of carbon.

The light-shielding film may consist of a single layer or multiple layers or even a single layer with continuous compositional grading in a thickness direction or multiple layers with stepwise compositional grading in a thickness direction including at least one layer containing a transition metal and silicon. In the case of multilayer construction, layers other than the transition metal and silicon-containing layer include a tungsten layer, tantalum layer or the like.

The light-shielding film preferably has a thickness of 10 to 80 nm. Although the exact thickness depends on the construction of the light-shielding film, no sufficient light-shielding effect may be available at a thickness of less than 10 nm, and a film with a thickness in excess of 80 nm may interfere with high-accuracy processing using a thin resist film with a thickness equal to or less than 250 nm or cause the substrate to bow due to film stress. When an etching mask film is used as will be described later, a film thickness greater than the range is acceptable insofar as means for solving the problem of film stress is employed.

The light-shielding film used herein is a film imparting a light-shielding effect to exposure light during use of the photomask and is not particularly limited. When the photomask blank is of the layer construction wherein when the photomask blank is processed into a photomask, the light-shielding film mainly plays the light shielding role of the photomask, for example, it is a photomask blank wherein the light-shielding film is disposed directly on the transparent substrate as illustrated in FIGS. 1A, 2A, 3A, 4A and 5A, or a photomask blank wherein the light-shielding film is disposed on the transparent substrate via a phase shift film as illustrated in FIGS. 1B, 2B, 3B, 4B and 5B, the phase shift film being of full transmission type, the composition and thickness of the light-shielding film are preferably adjusted so that it may have an optical density of 1 to 4 relative to the exposure light. In this case, the light-shielding film preferably has a thickness of 10 to 80 nm.

On the other hand, when the photomask blank is of the construction wherein another film of mainly playing the light shielding role of the photomask is present in addition to the light-shielding film, for example, it is a photomask blank wherein the light-shielding film is disposed on the transparent substrate via a phase shift film as illustrated in FIGS. 1B, 2B, 3B, 4B and 5B, the phase shift film being a halftone phase shift film having a transmittance of exposure light of about 5% to about 30%, the composition and thickness of the light-shielding film are preferably adjusted so that it may have an optical density of 0.2 to 4 relative to the exposure light. In this case, the light-shielding film preferably has a thickness of 10 to 70 nm.

The antireflective film of chromium-based material may function as an etching mask when a film susceptible to fluorine dry etching is etched. In this case, the antireflective film of chromium-based material is preferably composed of chromium alone or a chromium compound containing chromium and at least one element selected from oxygen, nitrogen and carbon, with a chromium content of at least 50 atom %. Then the antireflective film can exert an etching mask function effectively without a need for thickness increase.

In order to function as an antireflective film, the material must have certain levels of light transmission and absorption. Even metallic chromium or materials having a chromium content of more than 85 atom % can be used as a partial layer in the film if the layer is extremely thin. The design preferred for enhancing a mask function during etching is a combination of a layer with a chromium content in excess of 50 atom % and a layer with a relatively low chromium content (e.g., equal to or less than 40 atom %) because the etching mask effect abruptly rises when the chromium content exceeds 50 atom %.

With respect to the thickness of the antireflective film used herein, an antireflection effect is generally obtained at a thickness in the range of 5 to 50 nm, preferably 10 to 30 nm, although the exact thickness varies with the wavelength of light used in inspection required in the manufacture or use of the photomask. A thickness in the range of 15 to 25 nm is preferred especially for the ArF excimer laser lithography.

Either the light-shielding film or the antireflective film may be deposited by well-known methods. The sputtering process is often used because a homogeneous film can be formed most easily. The sputtering process is yet the preferred deposition process used herein. When a film containing a transition metal and silicon is to be deposited, the target used may be a single target containing silicon and transition metal in a controlled ratio. Alternatively, a ratio of silicon to transition metal may be adjusted by selecting appropriate ones from a silicon target, a transition metal target, and targets of silicon and transition metal (transition metal silicide targets) and controlling the sputtering area of the selected targets or the power applied to the selected targets. On the other hand, when a film is formed of a chromium compound, a chromium target may be used. It is noted that when the film contains light elements such as oxygen, nitrogen, and carbon, such a film can be deposited by reactive sputtering wherein an oxygen-containing gas, nitrogen-containing gas and/or carbon-containing gas is added to the sputtering gas as a reactive gas.

The photomask blank of the invention may be one comprising an etching mask film of a single layer or multilayer structure which is deposited contiguous to the antireflective film, resistant to fluorine dry etching and removable by chlorine dry etching, as in the second embodiment. The etching mask film functions as an etching mask during fluorine dry etching of the light-shielding film.

Particularly in the event the light-shielding film pattern is to be left at a high accuracy on the phase shift pattern of the phase shift film or transparent substrate, it must be etch processed while fully protecting the antireflective film with a first resist film pattern formed initially, so as to avoid any damages to the antireflective film. The phase shifter is then processed using a second resist film pattern which is formed after the first resist film pattern is stripped. If retrogression occurs due to damages by pattern-wise etching of the second resist film, a film affording light-shielding property lowers its function.

For preventing this, the resist film must have high etching resistance or be formed thick. However, in a practical sense, there is often a tradeoff between imparting high etching resistance to the resist film or forming the resist film to an increased thickness and imparting a high resolution to the resist film to form a fine resist pattern. When the ultimate mask pattern is required to have a micro-structure and a high accuracy, the use of an etching mask film is preferred in some cases, though it makes the process complicated.

Like the etch stop film, the etching mask film has functions of providing certain resistance to fluorine dry etching and enabling selective etching relative to the material containing a transition metal and silicon. To enhance etching accuracy during the etching of the phase shifter, the etching mask film must have greater resistance to fluorine dry etching. The preferred materials satisfying such requirements are chromium-based materials among other materials as exemplified for the etch stop film. When the etching mask film is used as an etching mask for deep etching of the transparent substrate, as in the case of Levenson masks and chromeless masks wherein the phase shifter is formed by etching the transparent substrate, chromium-based materials are especially preferred because extremely high etching resistance is required for the etching mask film.

The desired chromium-based materials include chromium alone and chromium compounds containing chromium and at least one element selected from oxygen, nitrogen and carbon and should preferably be free of silicon. More illustrative examples of the chromium compound include chromium oxide, chromium nitride, chromium oxynitride, chromium oxycarbide, chromium nitride carbide, and chromium oxide nitride carbide.

An etching mask film is improved in etching resistance at a chromium content of at least 50 atom %, especially at least 60 atom %, though depending on the film thickness. Then using chromium alone or chromium compounds with a chromium content in the range, an etching mask film which is expected to have a better etching mask effect can be formed without increasing the thickness of the film.

The chromium-based material has, for example, a composition consisting essentially of 50 atom % to 100 atom %, specifically 60 atom % to 100 atom % of chromium, 0 atom % to 50 atom %, specifically 0 atom % to 40 atom % of oxygen, 0 atom % to 50 atom %, specifically 0 atom % to 40 atom % of nitrogen, and 0 atom % to 20 atom %, specifically 0 atom % to 10 atom % of carbon. The chromium-based material having this composition can form an etching mask film having sufficient etching selectivity relative to the light-shielding film and/or transparent substrate.

When the etching mask film is formed using the above material to a thickness of about 2 to 30 nm, especially about 5 to 30 nm, it can be processed so as to acquire a satisfactory etching mask effect without raising the problem of pattern density dependency. This enhances the accuracy of etch processing of the film underlying the etching mask film and the transparent substrate.

The etching mask film used herein may have a single layer structure or a multilayer structure. The single layer structure simplifies the film construction and the process reflective thereon.

Like the etch stop film, the etching mask film, which is formed from metallic chromium or a chromium compound with a high chromium content, is sometimes short of the adhesion at the interface between the etching mask film and a contiguous film of different material or the resist. In such cases, like the etch stop film, the etching mask film is tailored by constructing a portion of the etching mask film which is contiguous to the antireflective film, or a portion of the etching mask film which is contiguous to the resist film, that is, one or both of opposite surface portions of the etching mask film in a thickness direction in the case of single layer structure, and one or both of remotest layers of the etching mask film in a thickness direction in the case of multilayer structure, so as to have a higher oxygen and/or nitrogen content than the region with the highest chromium content in a thickness direction. Then the adhesion to the antireflective film can be improved to prevent occurrence of defects, or the adhesion to the resist film can be improved to prevent the resist pattern from collapsing. These structures can be readily formed by controlling the parameters of reactive sputtering.

Notably, when the photomask blank has an etching mask film, it is sometimes advantageous to establish selective etching between the etch stop film and the etching mask film. In this case, if the etching mask film is made of a chromium-based material and the etch stop film is made of tantalum alone or a tantalum compound containing tantalum, free of silicon, then selective etching is possible between the etch stop film and the etching mask film.

The etching mask film can be deposited by well-known methods. The sputtering process is preferable and may be either DC sputtering, RF sputtering or the like.

The etching mask film may be deposited by a procedure used in the prior art for chromium-based light-shielding films and antireflective films. One commonly used method is by sputtering a chromium target in an inert gas such as argon, a reactive gas such as oxygen-containing gas, nitrogen-containing gas or carbon-containing gas, or a mixture of an inert gas and a reactive gas. See JP-A 7-140635, for example.

Described below are the photomask blanks of the third to fifth embodiments referred to above as the construction permitting the light-shielding film and antireflective film to be processed by two dry etching steps.

The photomask blank of the third embodiment is expected to achieve the best improvements over the problem of pattern density dependency arising in forming a transferred pattern with a feature size equal to or less than 0.4 μm. In addition, the layer of the antireflective film which is disposed remote from the transparent substrate (surface side layer) is formed of a material resistant to fluorine dry etching. If its etching mask function is utilized during the processing step, the use of an etching mask film is not always needed. Then, the number of processing steps can be reduced because the step of eventually removing the etching mask film is omitted.

On the other hand, while the surface side layer of the antireflective film is used as an etching mask, any underlying film (or layer) or transparent substrate is etched to form a phase shifter. To this end, the antireflective film is constructed so as to contain more light elements than films with better light-shielding effect of materials of the same family.

In the third embodiment, the surface side layer of the antireflective film made of chromium-based material preferably has an atomic composition consisting essentially of 30 atom % to 70 atom %, specifically 35 atom % to 50 atom % of chromium, 0 atom % to 60 atom %, specifically 20 atom % to 60 atom % of oxygen, 0 atom % to 50 atom %, specifically 3 atom % to 30 atom % of nitrogen, and 0 atom % to 20 atom %, specifically 0 atom % to 5 atom % of carbon.

The surface side layer of the antireflective film, when its composition is graded in a thickness direction, preferably has a composition consisting essentially of 30 atom % to 100 atom %, specifically 35 atom % to 90 atom % of chromium, 0 atom % to 60 atom %, specifically 3 atom % to 60 atom % of oxygen, 0 atom % to 50 atom %, specifically 3 atom % to 50 atom % of nitrogen, and 0 atom % to 30 atom %, specifically 0 atom % to 20 atom % of carbon.

With respect to the thickness of the antireflective film used herein, an antireflection effect is generally obtained at an overall thickness in the range of 10 to 30 nm, although the exact thickness varies with the wavelength of light used in inspection required in the manufacture or use of the photomask. A thickness in the range of 15 to 25 nm is preferred especially for the ArF excimer laser lithography.

The function of the antireflective film is exerted when a layer susceptible to fluorine dry etching (first antireflective layer) and a layer resistant to fluorine dry etching (second antireflective layer) cooperate together.

In this embodiment, the second antireflective layer has a thickness of 2 to 25 nm, especially 2 to 20 nm, and the first antireflective layer has a thickness corresponding to the balance of the overall thickness described above.

The photomask blank of the fourth embodiment is expected to achieve better improvements over the problem of pattern density dependency arising in forming a transferred pattern with a feature size equal to or less than 0.4 μm. In addition, the layer of the light-shielding film which is disposed adjacent to the antireflective film and the antireflective film are formed of a material resistant to fluorine dry etching. If their etching mask function is utilized during the processing step, the use of an etching mask film is not always needed. Then, the number of processing steps can be reduced because the step of eventually removing the etching mask film is omitted.

On the other hand, while the layer of the light-shielding film which is disposed adjacent to the antireflective film and the antireflective film are used as an etching mask, any underlying film (or layer) or transparent substrate is etched to form a phase shifter. If the resist film is retrogressed by damages during the step, the antireflective film is also damaged. In such a situation, the layer of the light-shielding film which is disposed adjacent to the antireflective film is tailored to a relatively low content of light elements, whereby the etching mask function is enhanced as compared with the use of a material resistant to fluorine dry etching only in the antireflective film.

In the fourth embodiment, the antireflective film made of chromium-based material preferably has an atomic composition consisting essentially of 30 atom % to 85 atom % of chromium, 0 atom % to 60 atom % of oxygen, 0 atom % to 50 atom % of nitrogen, and 0 atom % to 20 atom % of carbon. The antireflective film preferably has a thickness of at least 5 nm when a relatively intense etching mask function is required. It also preferably has a thickness of up to 50 nm because the effect of improving pattern density dependency is extremely weakened at a thickness in excess of 50 nm.

The photomask blank of the fifth embodiment is expected to achieve improvements over the problem of pattern density dependency arising in forming a transferred pattern with a feature size equal to or less than 0.4 μm. In addition, the antireflective film is formed of a material resistant to fluorine dry etching. If its etching mask function is utilized during the processing step, the use of an etching mask film is not always needed. Then, the number of processing steps can be reduced because the step of eventually removing the etching mask film is omitted.

While the antireflective film is used as an etching mask, any underlying film (or layer) or transparent substrate is etched to form a phase shifter. To this end, the antireflective film is constructed so as to contain more light elements than films with better light-shielding effect of materials of the same family.

In the fifth embodiment, the antireflective film made of chromium-based material preferably has an atomic composition consisting essentially of 30 atom % to 95 atom % of chromium, 0 atom % to 60 atom % of oxygen, 0 atom % to 50 atom % of nitrogen, and 0 atom % to 20 atom % of carbon.

With respect to the thickness of the antireflective film used herein, an antireflection effect is generally obtained at a thickness in the range of 15 to 30 nm, although the exact thickness varies with the wavelength of light used in inspection required in the manufacture or use of the photomask. A thickness in the range of 20 to 25 nm is preferred especially for the ArF excimer laser lithography.

In this embodiment, the second light-shielding layer has a thickness of 2 to 55 nm, especially 2 to 30 nm, and the first light-shielding layer has a thickness corresponding to the balance of the overall thickness of the light-shielding film described above.

As viewed from the standpoint of etching resistance, each of the light-shielding film and the antireflective film in the photomask blanks of the third to fifth embodiments is constructed from a lower section susceptible to fluorine dry etching and an upper section resistant to fluorine dry etching and removable by chlorine dry etching. In the third embodiment, the light-shielding film and first antireflective layer correspond to the lower section, and the second antireflective layer corresponds to the upper section. In the fourth embodiment, the light-shielding film corresponds to the lower section, and the antireflective film corresponds to the upper section. In the fifth embodiment, the first light-shielding layer corresponds to the lower section, and the antireflective film and second light-shielding layer correspond to the upper section. Accordingly, in processing the photomask blanks of the third to fifth embodiments into photomasks, a halftone phase shift mask (tritone phase shift mask), chromeless mask and Levenson mask can be individually produced by applying a common etching procedure.

In the photomask blank of the invention, in order that films having light-shielding property deposited on the transparent substrate (which correspond to a light-shielding film, an etch stop film imparting complementary light-shielding property (an etch stop film of a certain type can impart complementary light-shielding property), an antireflective film imparting complementary light-shielding property (an antireflective film of a certain type can impart complementary light-shielding property), a halftone phase shift film or the like) function as a whole to provide sufficient light-shielding property, the photomask blank should desirably be processed into a photomask in which the films having light-shielding property have an overall optical density OD of 1.0 to 3.5 relative to exposure light during use of the photomask.

Also, the combination of light-shielding film, antireflective film and etch stop film, and if a halftone phase shift film is used together, the combination of etching mask film, light-shielding film, antireflective film, etch stop film, and halftone phase shift film should preferably have an optical density OD of at least 2.5, more preferably at least 2.8, and even more preferably at least 3.0.

For the light-shielding film containing light elements such as oxygen, nitrogen and carbon, in particular, sufficient light-shielding property may not be obtained when the content of light elements exceeds a certain level. When the photomask blank of the invention is adapted for exposure to light with a wavelength equal to or less than 193 nm (to which the invention is advantageously applied), for example, exposure to ArF excimer laser with a wavelength 193 nm, or exposure to $F_2$ laser with a wavelength 153 nm, it is preferred that the light-shielding film have a nitrogen content of up to 20 atom %, a carbon content of up to 20 atom %, an oxygen content of up to 10 atom %, and especially a total content of nitrogen, carbon and oxygen of up to 40 atom %. Satisfactory light shielding property is obtained when at least a portion, preferably the entirety of the light-shielding film has a composition within the range.

The transparent substrate is preferably selected from substrates composed mainly of silicon oxide, typically quartz substrates. When a phase shift film is used, it may be either a full transmission phase shift film or a halftone phase shift film, for example, a halftone phase shift film having a transmittance of 5 to 30%. The phase shift film used herein is preferably a film which can be etched by fluorine dry etching. Examples of the material of which the phase shift film is made include silicon-containing materials, preferably transition metal silicon compounds containing a transition metal, silicon and at least one element selected from oxygen, nitrogen and carbon, more preferably transition metal silicon compounds containing a transition metal, silicon and at least one of nitrogen and oxygen. Examples of the silicon-containing material are as exemplified above as the silicon-containing compound for the light-shielding film; and examples of the transition metal are as exemplified above as the transition metal for the light-shielding film. The phase shift film has a thickness which is selected so as to shift the phase of light by a predetermined quantity, typically 180° relative to the exposure light during the use of the photomask.

The phase shift film can be deposited by well-known methods. Among others, the sputtering process is preferable because a homogeneous film can be formed most easily. The sputtering process may be either DC sputtering, RF sputtering or the like.

The target and sputtering gas are selected in accordance with the desired film composition. When a phase shift film containing a transition metal and silicon is formed, the target used may be a single target containing silicon and transition metal in a controlled ratio. Alternatively, a ratio of silicon to transition metal may be adjusted by selecting appropriate ones from a silicon target, a transition metal target, and targets of silicon and transition metal (transition metal silicide targets) and controlling the sputtering area of the selected targets or the power applied to the selected targets. It is noted that when the film contains light elements such as oxygen, nitrogen, and carbon, such a film can be deposited by reactive sputtering wherein an oxygen-containing gas, nitrogen-containing gas and/or carbon-containing gas is added to the sputtering gas as a reactive gas.

According to the invention, a photomask is obtained from the above-described photomask blank by patterning the respective films of the blank as desired by fluorine dry etching and chlorine dry etching in a proper combination, for forming on the transparent substrate a mask pattern including transparent regions and effectively opaque regions to exposure light.

As used in the context that a certain material or layer is susceptible to fluorine dry etching, the term "fluorine dry etching" refers to dry etching using a fluorine-containing gas. The fluorine-containing gas may be any gas containing fluorine element, specifically fluorine gas, gases containing carbon and fluorine such as $CF_4$ and $C_2F_6$, gases containing sulfur and fluorine such as $SF_6$, or a mixture of a fluorine-free gas such as helium and a fluorine-containing gas. Other gases such as oxygen may be added thereto if necessary.

As used in the context that a certain material or layer is resistant to fluorine dry etching and removable by chlorine dry etching, the term "chlorine dry etching" refers to dry etching using a chlorine-containing gas. Chlorine dry etching conditions are well known for the dry etching of chromium compound films and not particularly limited. For example, the etchant gas is a mixture of chlorine gas and oxygen gas in a volume flow rate ratio ($Cl_2$ gas:$O_2$ gas) of 1:2 to 20:1, optionally in admixture with an inert gas such as helium. When oxygen gas is admixed at a volume flow rate ratio of at least 5% relative to the chlorine gas, no substantial etching takes place on the transition metal and silicon-containing materials of which the light-shielding film and antireflective film are formed and the transparent substrate in the photomask blank of the invention.

Referring to the drawings, the processes of manufacturing photomasks from the photomask blanks of the first to fifth embodiments are described in detail.

(1) The Photomask Manufacturing Process A Wherein the Photomask Blank of the First Embodiment is Processed Into a Photomask (Levenson Mask)

Figure 6A:
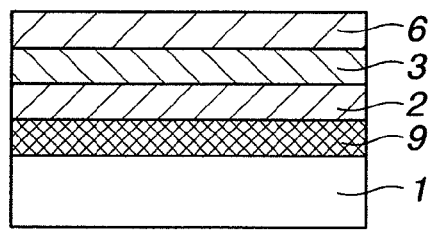
Figure 6B:
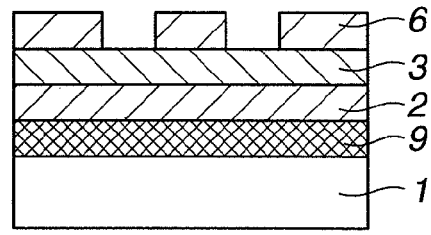
Figure 6C:
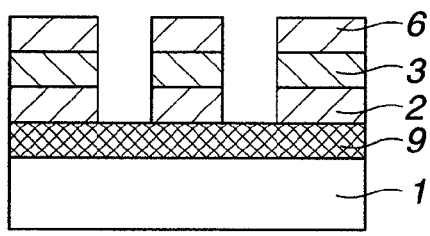
Figure 6D:
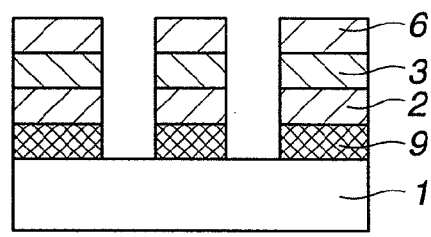

The process starts with a photomask blank comprising an etch stop film 9 resistant to fluorine dry etching and removable by chlorine dry etching, a light-shielding film 2 susceptible to fluorine dry etching, and an antireflective film 3 susceptible to fluorine dry etching, deposited on a transparent substrate 1 in the described sequence (FIG. 1A). A first resist film 6 is coated onto the blank (FIG. 6A) and then developed to form a pattern of first resist film 6 corresponding to the configuration of a portion of light-shielding film 2 to be left (FIG. 6B). With the pattern of first resist film 6 serving as an etching mask, fluorine dry etching is then performed for transferring the pattern of first resist film 6 to the antireflective film 3 and light-shielding film 2 (FIG. 6C). Further etch stop film 9 is etched by chlorine dry etching (dry etching with chlorine and oxygen). All the portions of the respective films to be removed are removed without damages to the transparent substrate (FIG. 6D).

Figure 6E:
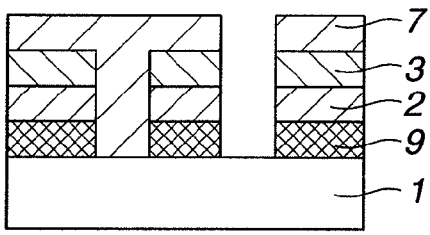
Figure 6F:
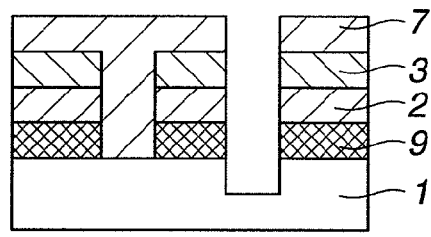
Figure 6G:
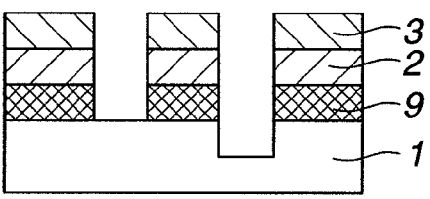

Once first resist film 6 is stripped, a second resist film 7 is coated again. The second resist film 7 is processed into a pattern that protects the area where light-shielding film 2 is to be left and the area where transparent substrate 1 is not to be etched among the area where light-shielding film 2 has been removed (FIG. 6E). By fluorine dry etching, the area of transparent substrate 1 to be processed (the area where second resist film 7 has been removed) is etched to a predetermined depth. This forms a phase shifter in transparent substrate 1 (FIG. 6F). Finally, second resist film 7 is removed, completing a Levenson mask (FIG. 6G).

(2) The Photomask Manufacturing Process B Wherein the Photomask Blank of the First Embodiment is Processed Into a Photomask (Halftone Phase Shift Mask or Tritone Phase Shift Mask)

Figure 7A:
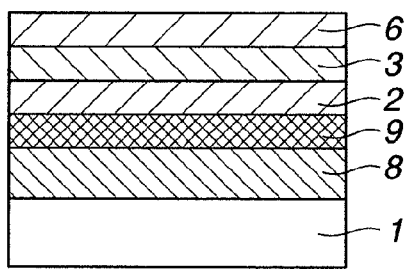
Figure 7B:
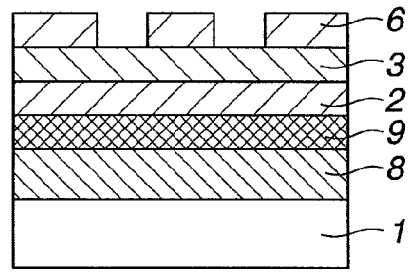
Figure 7C:
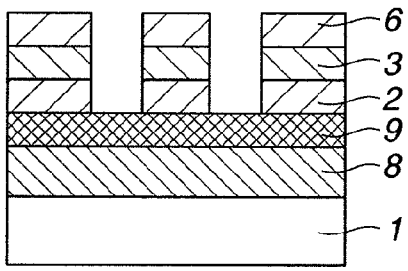
Figure 7D:
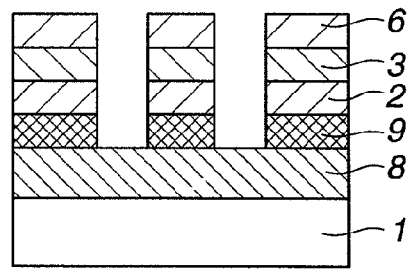

The process starts with a photomask blank comprising a halftone phase shift film 8 susceptible to fluorine dry etching, an etch stop film 9 resistant to fluorine dry etching and removable by chlorine dry etching, a light-shielding film 2 susceptible to fluorine dry etching, and an antireflective film 3 susceptible to fluorine dry etching, deposited on a transparent substrate 1 in the described sequence (FIG. 1B). A first resist film 6 is coated onto the blank (FIG. 7A) and then processed to form a pattern of first resist film 6 corresponding to the configuration of a portion of halftone phase shift film 8 to be left (FIG. 7B). With the pattern of first resist film 6 serving as an etching mask, fluorine dry etching is then performed for transferring the pattern of first resist film 6 to antireflective film 3 and light-shielding film 2 (FIG. 7C). Further etch stop film 9 is etched by chlorine dry etching (dry etching with chlorine and oxygen), forming an opening at the area where halftone phase shift film 8 is to be removed (FIG. 7D).

Figure 7E:
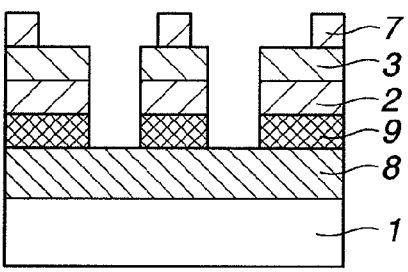
Figure 7F:
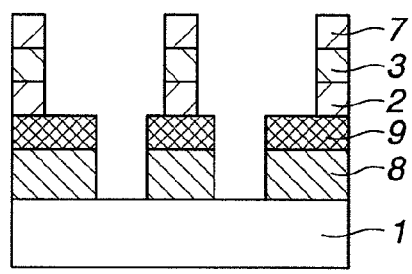
Figure 7G:
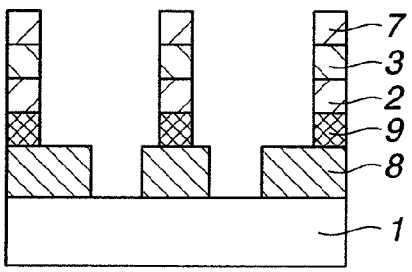
Figure 7H:
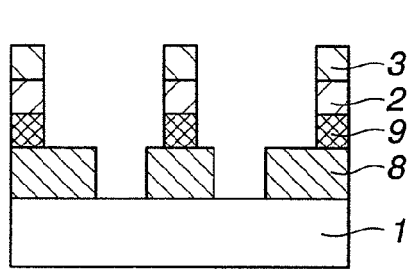

Once first resist film 6 is stripped, a second resist film 7 is coated again. The second resist film 7 is processed into a pattern at the area where light-shielding film 2 is to be left, protecting light-shielding film 2 and antireflective film 3 (FIG. 7E). Fluorine dry etching is then performed, whereby a portion of halftone phase shift film 8 to be removed (in register with the opening in etch stop film 9) is removed and those portions of antireflective film 3 and light-shielding film 2 which are not protected by second resist film 7 are removed (FIG. 7F). Thereafter, chlorine dry etching (dry etching with chlorine and oxygen) is performed again, whereby the portion of etch stop film 9 which is not protected by second resist film 7 (the portion exposed after removal of light-shielding film 2) is removed (FIG. 7G). All the portions of the respective films to be removed are removed without damages to transparent substrate 1 and halftone phase shift film 8 (FIG. 7H).

If it is desired to leave a portion of the light-shielding film only at the light-shielding band (usually photomask periphery), the process may be modified such that after the antireflective film and light-shielding film are etched through the pattern of the first resist film, only the light-shielding band is protected by the second resist film. The subsequent steps are the same. By this modification, a general halftone phase shift mask is produced.

(3) The Photomask Manufacturing Process C Wherein the Photomask Blank of the Second Embodiment is Processed Into a Photomask (Levenson Mask)

An exemplary procedure of processing a photomask blank having an etching mask film into a Levenson mask is described.

Figure 8A:
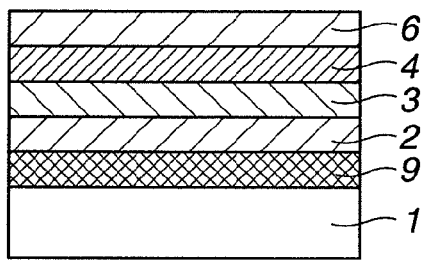
Figure 8B:
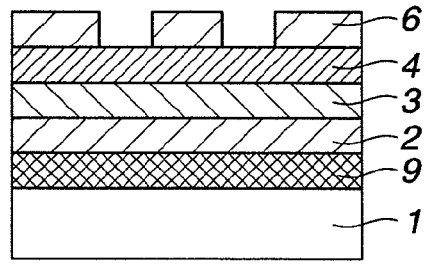
Figure 8C:
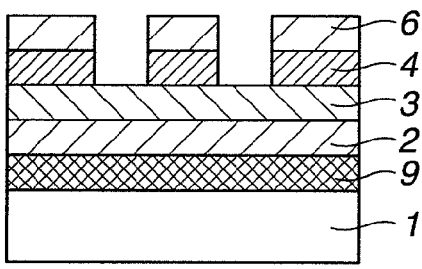
Figure 8D:
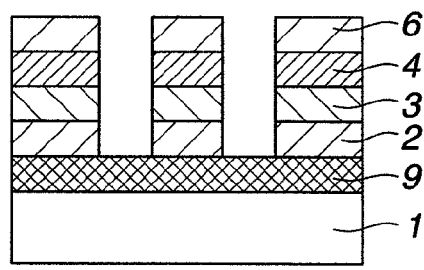
Figure 8E:
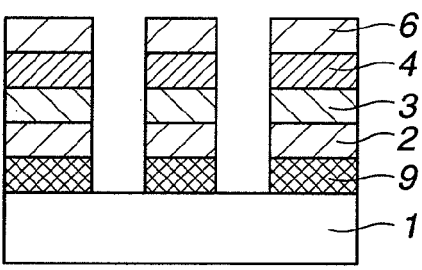

The process starts with a photomask blank comprising an etch stop film 9 resistant to fluorine dry etching and removable by chlorine dry etching, a light-shielding film 2 susceptible to fluorine dry etching, an antireflective film 3 susceptible to fluorine dry etching, and an etching mask film 4 resistant to fluorine dry etching and removable by chlorine dry etching, deposited on a transparent substrate 1 in the described sequence (FIG. 2A). A first resist film 6 is coated onto the blank (FIG. 8A) and then developed to form a pattern of first resist film 6 corresponding to the configuration of a portion of light-shielding film 2 to be left (FIG. 8B). With the pattern of first resist film 6 serving as an etching mask, chlorine dry etching (dry etching with chlorine and oxygen) is then performed for transferring the pattern of first resist film 6 to etching mask film 4 (FIG. 8C). Fluorine dry etching is then performed for transferring the pattern of etching mask film 4 to antireflective film 3 and light-shielding film 2 (FIG. 8D). Further etch stop film 9 is etched by chlorine dry etching (dry etching with chlorine and oxygen). All the portions of the respective films to be removed are removed without damages to transparent substrate 1 (FIG. 8E).

Figure 8F:
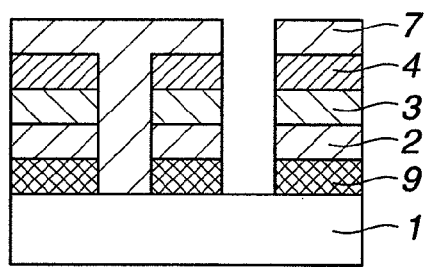
Figure 8G:
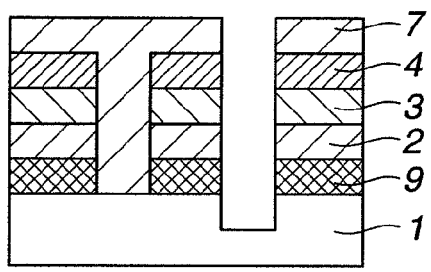
Figure 8H:
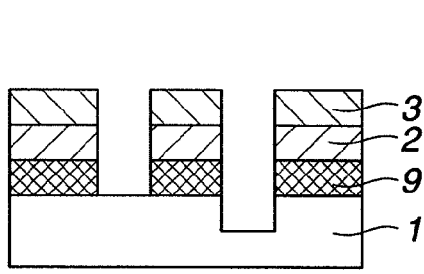

Once first resist film 6 is stripped, a second resist film 7 is coated again. The second resist film 7 is processed into a pattern that protects the area where light-shielding film 2 is to be left and the area where transparent substrate 1 is not to be etched among the area where light-shielding film 2 has been removed (FIG. 8F). By fluorine dry etching, the area of transparent substrate 1 to be processed (the area where second resist film 7 has been removed) is etched to a predetermined depth. This forms a phase shifter in transparent substrate 1 (FIG. 8G). Finally, second resist film 7 is removed, completing a Levenson mask (FIG. 8H).

(4) The Photomask Manufacturing Process D Wherein the Photomask Blank of the Second Embodiment is Processed Into a Photomask (Zebra Type Chromeless Mask)

The film arrangement like the photomask blank of the second embodiment exerts its effect to a full extent when the blank is processed into a mask having a more complex light-shielding film pattern formed on the processed phase shift film, for example, a zebra type chromeless mask. Described below is one exemplary process toward a zebra type chromeless mask.

Figure 9A:
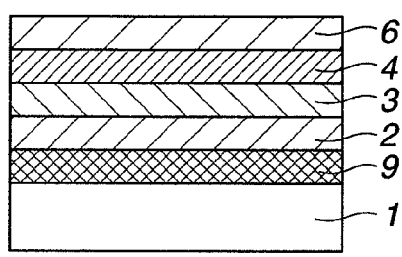
Figure 9B:
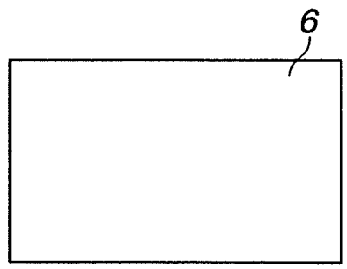
Figure 9C:
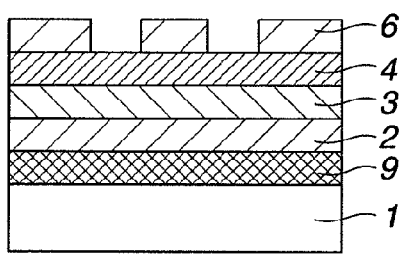
Figure 9D:
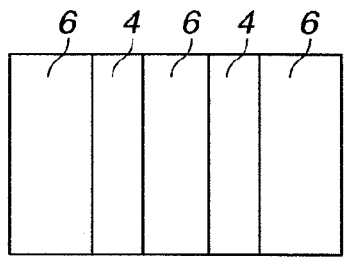
Figure 9E:
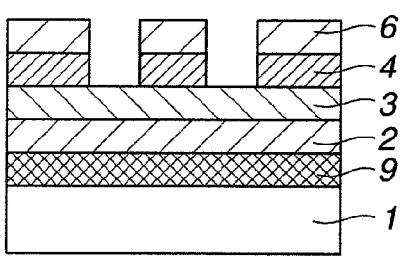
Figure 9F:
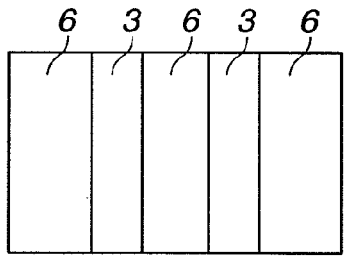
Figure 9G:
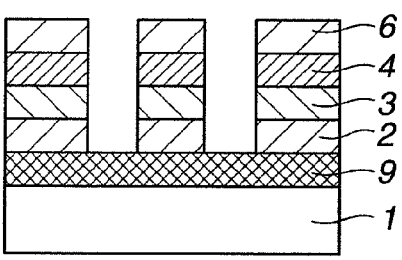
Figure 9H:
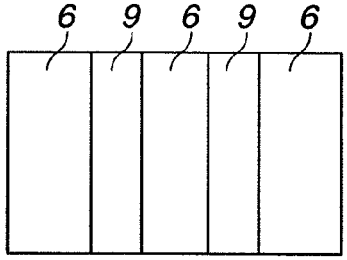
Figure 9I:
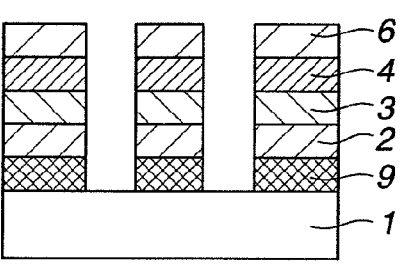
Figure 9J:
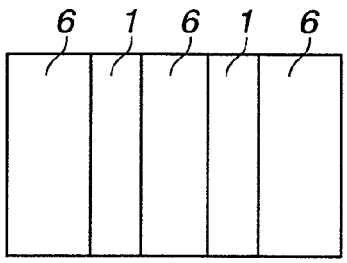

The process starts with a photomask blank comprising an etch stop film 9 resistant to fluorine dry etching and removable by chlorine dry etching, a light-shielding film 2 susceptible to fluorine dry etching, an antireflective film 3 susceptible to fluorine dry etching, and an etching mask film 4 resistant to fluorine dry etching and removable by chlorine dry etching, deposited on a transparent substrate 1 in the described sequence (FIG. 2A). A first resist film 6 is coated onto the blank (FIGS. 9A, 9B) and then developed to form a pattern of first resist film 6 which is open where transparent substrate 1 is to be dug (FIGS. 9C, 9D). With the pattern of first resist film 6 serving as an etching mask, chlorine dry etching (dry etching with chlorine and oxygen) is then performed for transferring the pattern of first resist film 6 to etching mask film 4 (FIGS. 9E, 9F). Fluorine dry etching is then performed to etch away those portions of antireflective film 3 and light-shielding film 2 within the openings in etching mask film 4 (FIGS. 9G, 9H). By further chlorine dry etching (dry etching with chlorine and oxygen), etch stop film 9 is etched (FIGS. 9I, 9J).

Figure 10A:
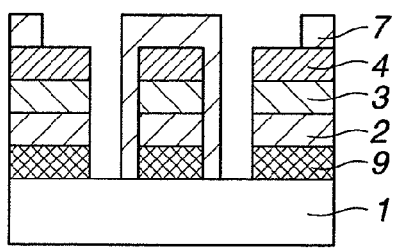
Figure 10B:
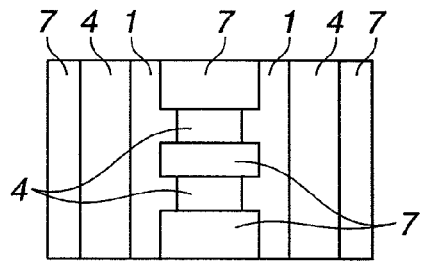
Figure 10C:
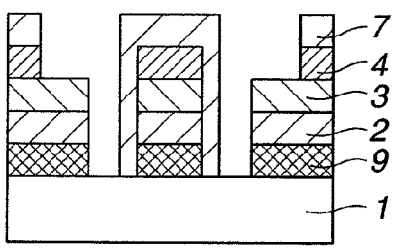
Figure 10D:
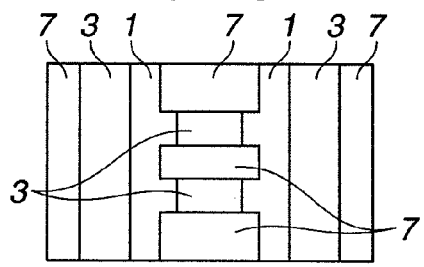

Once first resist film 6 is stripped, a second resist film 7 is coated again. The second resist film 7 is processed into a pattern that corresponds to the configuration of a portion of light-shielding film 2 to be left (FIGS. 10A, 10B). Notably, in the event the pattern of second resist film 7 is an extremely fine dot pattern, since the portion of transparent substrate 1 which has already been exposed is not a portion subject to etching through the pattern of second resist film 7, the pattern of second resist film 7 may be intentionally formed so as to override this portion for preventing the fine dot pattern of second resist film 7 from collapsing. Next, with the pattern of second resist film 7 serving as an etching mask, chlorine dry etching (dry etching with chlorine and oxygen) is performed, thereby removing a portion of etching mask film 4 corresponding to the area where light-shielding film 3 will be removed, but transparent substrate 1 will not be dug (FIGS. 10C, 10D).

Figure 10E:
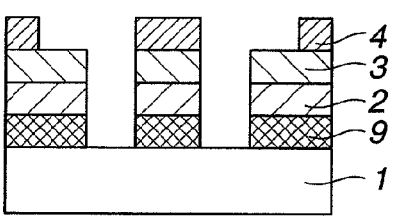
Figure 10F:
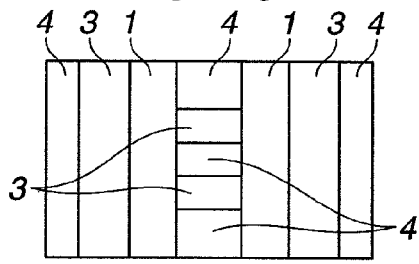
Figure 10G:
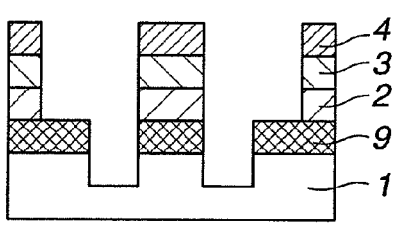
Figure 10H:
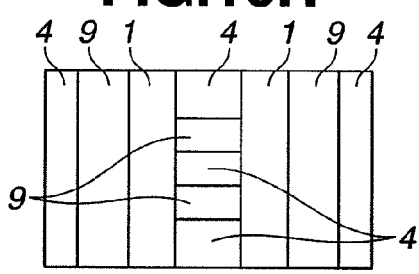
Figure 10I:
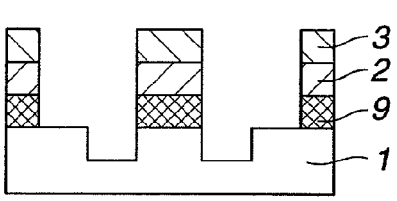
Figure 10J:
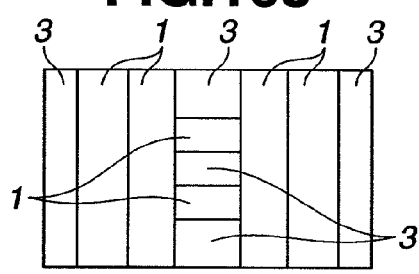

Thereafter, second resist film 7 is stripped (FIGS. 10E, 10F). By fluorine dry etching, transparent substrate 1 is etched to a predetermined depth. This forms a phase shifter in transparent substrate 1, and removes those portions of antireflective film 3 and light-shielding film 2 corresponding to the portion of etching mask film 4 which has been removed during the etching step using the pattern of second resist film 7, with only etch stop film 9 being left at that area (FIGS. 10G, 10H). Finally, chlorine dry etching (dry etching with chlorine and oxygen) is performed for removing the exposed portion of etch stop film 9 and the unremoved portion of etching mask film 4 overlying antireflective film 3 on light-shielding film 2 at the same time, completing a phase shift mask (zebra type chromeless mask) (FIGS. 10I, 10J).

(5) The Photomask Manufacturing Process E Wherein the Photomask Blank of the Second Embodiment is Processed Into a Photomask (Halftone Phase Shift Mask or Tritone Phase Shift Mask)

Figure 11A:
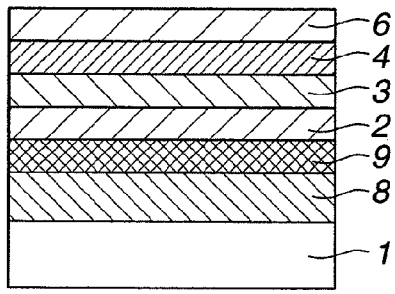
Figure 11B:
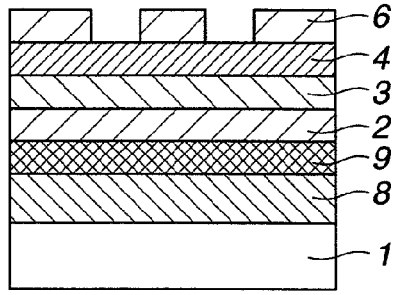
Figure 11C:
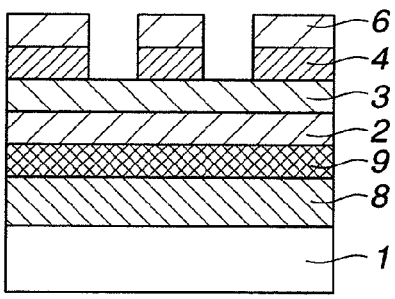
Figure 11D:
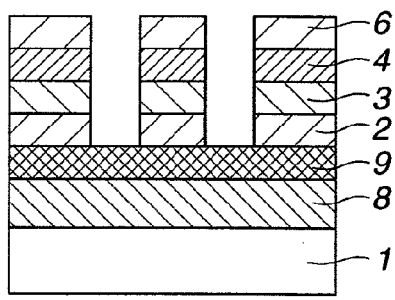

The process starts with a photomask blank comprising a halftone phase shift film 8 susceptible to fluorine dry etching, an etch stop film 9 resistant to fluorine dry etching and removable by chlorine dry etching, a light-shielding film 2 susceptible to fluorine dry etching, an antireflective film 3 susceptible to fluorine dry etching, and an etching mask film 4 resistant to fluorine dry etching and removable by chlorine dry etching, deposited on a transparent substrate 1 in the described sequence (FIG. 2B). A first resist film 6 is coated onto the blank (FIG. 11A) and then developed to form a pattern of first resist film 6 corresponding to the configuration of a portion of halftone phase shift film 8 to be left (FIG. 11B). With the pattern of first resist film 6 serving as an etching mask, chlorine dry etching (dry etching with chlorine and oxygen) is then performed for transferring the pattern of first resist film 6 to etching mask film 4 (FIG. 11C). Fluorine dry etching is then performed for transferring the pattern of first resist film 6 to antireflective film 3 and light-shielding film 2 (FIG. 11D).

Figure 11E:
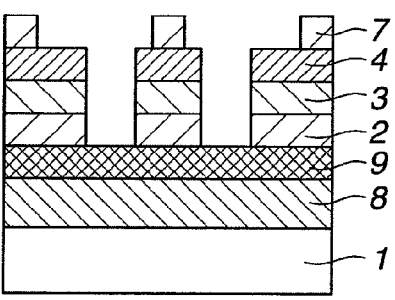
Figure 11F:
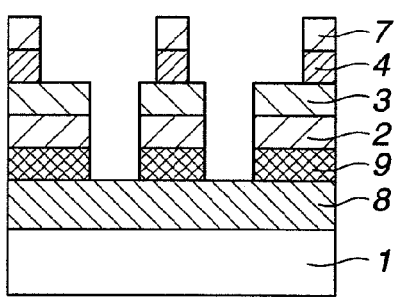
Figure 11G:
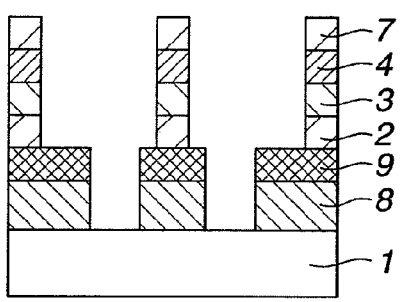
Figure 11H:
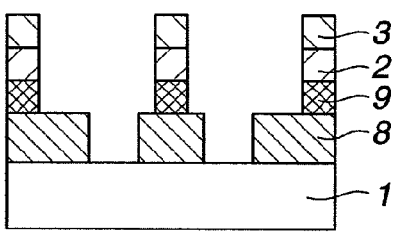

Once first resist film 6 is stripped, a second resist film 7 is coated again. The second resist film 7 is processed into a pattern that corresponds to the configuration of a portion of light-shielding film 2 to be left, for protecting the area of etching mask film 4 where light-shielding film 2 is to be left (FIG. 11E). Chlorine dry etching (dry etching with chlorine and oxygen) is then performed, whereby etch stop film 9 is etched, forming openings in the area where halftone phase shift film 8 is to be removed, and etching mask film 4 in the area where light-shielding film 2 is to be removed is removed (FIG. 11F). Fluorine dry etching is then performed, whereby those portions of halftone phase shift film 8 to be removed (in register with the openings in etch stop film 9) are removed, and those portions of antireflective film 3 and light-shielding film 2 which are not protected by second resist film 7 are removed (FIG. 11G). Then second resist film 7 is stripped, and chlorine dry etching (dry etching with chlorine and oxygen) is performed again, for removing the portion of etch stop film 9 which is left in the area where light-shielding film 2 is to be removed, and the unremoved portion of etching mask film 4 overlying the antireflective film 3 on light-shielding film 2 at the same time. All the portions of the respective films to be removed are removed without damages to transparent substrate 1 and halftone phase shift film 8, completing a tritone phase shift mask (FIG. 11H).

(6) The Photomask Manufacturing Process F Wherein the Photomask Blank of the Third Embodiment is Processed Into a Photomask (Levenson Mask)

Figure 12A:
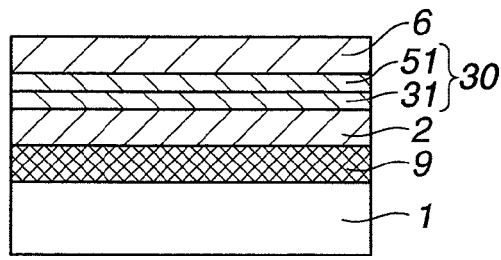
Figure 12B:
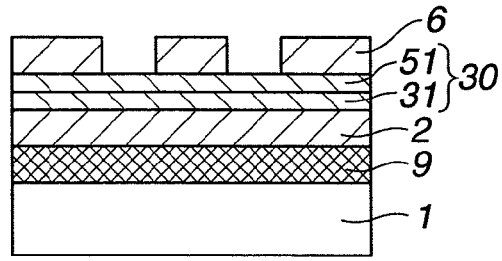
Figure 12C:
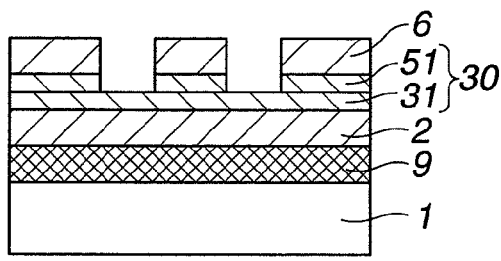
Figure 12D:
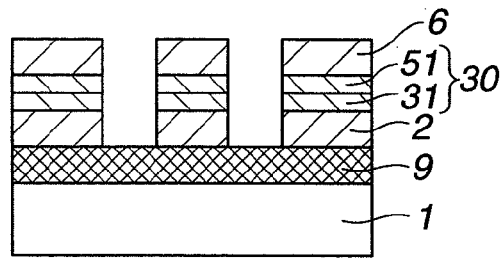
Figure 12E:
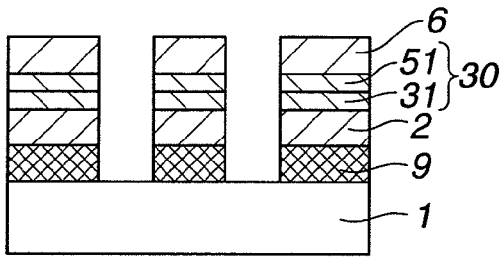

The process starts with a photomask blank comprising an etch stop film 9 resistant to fluorine dry etching and removable by chlorine dry etching, a light-shielding film 2 susceptible to fluorine dry etching, and an antireflective film 30 including a first antireflective layer 31 susceptible to fluorine dry etching and a second antireflective layer 51 resistant to fluorine dry etching, deposited on a transparent substrate 1 in the described sequence (FIG. 3A). A first resist film 6 is coated onto the blank (FIG. 12A) and then developed to form a pattern of first resist film 6 corresponding to the shape of a portion of light-shielding film 2 to be left (FIG. 12B). With the pattern of first resist film 6 serving as an etching mask, chlorine dry etching (dry etching with chlorine and oxygen) is then performed for transferring the pattern of first resist film 6 to second antireflective layer 51 (FIG. 12C). Fluorine dry etching is then performed for transferring the pattern of second antireflective layer 51 to first antireflective layer 31 and light-shielding film 2 (FIG. 12D). Further etch stop film 9 is etched by chlorine dry etching (dry etching with chlorine and oxygen). All the portions of the respective films to be removed are removed without damages to the transparent substrate (FIG. 12E).

Figure 12F:
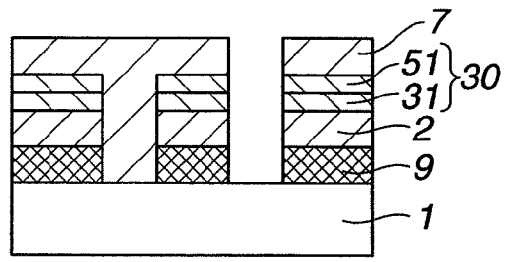
Figure 12G:
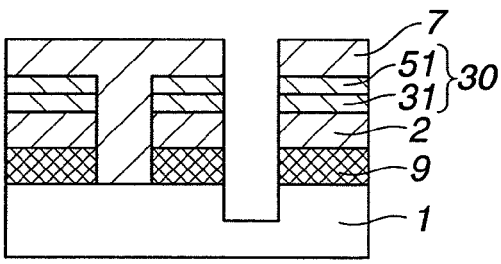
Figure 12H:
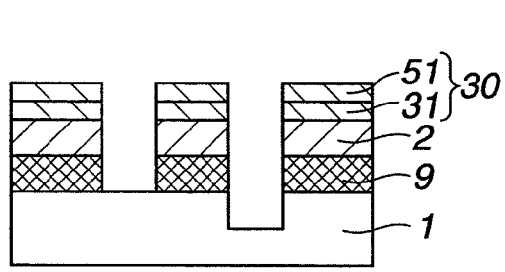

Once first resist film 6 is stripped, a second resist film 7 is coated again. The second resist film 7 is processed into a pattern that protects the area where light-shielding film 2 is to be left and the area where transparent substrate 1 is not to be etched among the area where light-shielding film 2 has been removed (FIG. 12F). By fluorine dry etching, the area of transparent substrate 1 to be processed (the area where second resist film 7 has been removed) is etched to a predetermined depth. This forms a phase shifter in transparent substrate 1 (FIG. 12G). Finally, second resist film 7 is removed, completing a Levenson mask (FIG. 12H).

(7) The Photomask Manufacturing Process G Wherein the Photomask Blank of the Third Embodiment is Processed Into a Photomask (Halftone Phase Shift Mask or Tritone Phase Shift Mask)

Figure 13A:
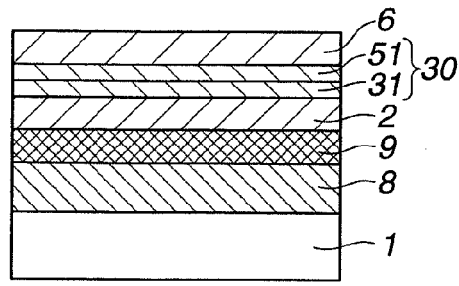
Figure 13B:
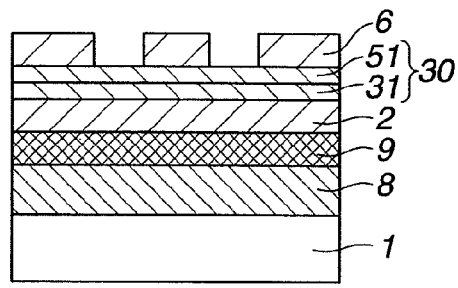
Figure 13C:
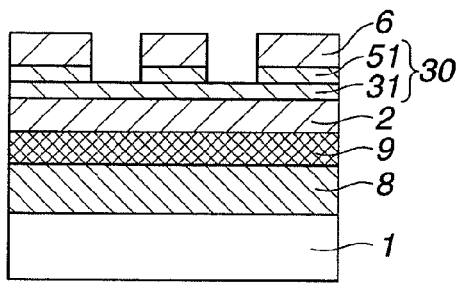
Figure 13D:
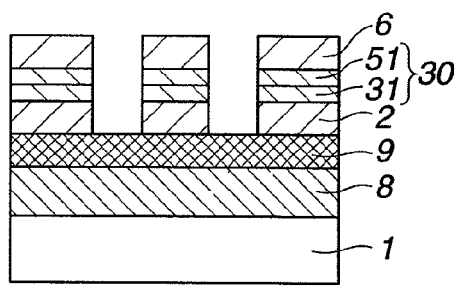

The process starts with a photomask blank comprising a halftone phase shift film 8 susceptible to fluorine dry etching, an etch stop film 9 resistant to fluorine dry etching and removable by chlorine dry etching, a light-shielding film 2 susceptible to fluorine dry etching, and an antireflective film 30 including a first antireflective layer 31 susceptible to fluorine dry etching and a second antireflective layer 51 resistant to fluorine dry etching, deposited on a transparent substrate 1 in the described sequence (FIG. 3B). A first resist film 6 is coated onto the blank (FIG. 13A) and then developed to form a pattern of first resist film 6 corresponding to the shape of a portion of phase shift film 8 to be left (FIG. 13B). With the pattern of first resist film 6 serving as an etching mask, chlorine dry etching (dry etching with chlorine and oxygen) is then performed for transferring the pattern of first resist film 6 to second antireflective layer 51 (FIG. 13C). Fluorine dry etching is then performed for transferring the pattern of second antireflective layer 51 to first antireflective layer 31 and light-shielding film 2 (FIG. 13D).

Figure 13E:
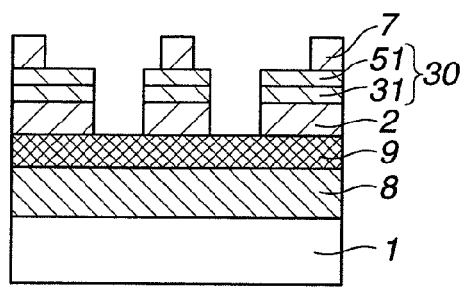
Figure 13F:
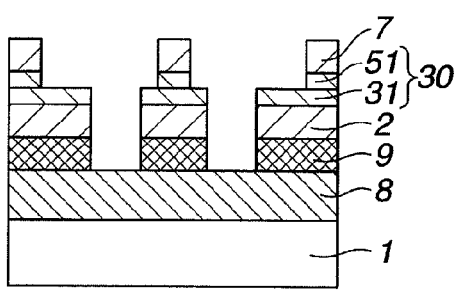
Figure 13G:
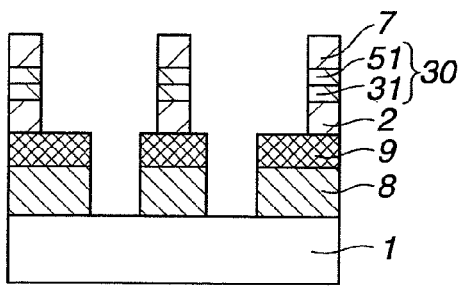
Figure 13H:
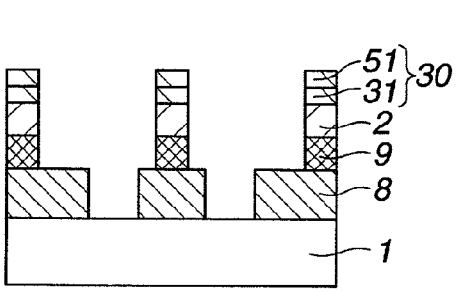

Once first resist film 6 is stripped, a second resist film 7 is coated again. The second resist film 7 is processed into a pattern corresponding to the portion of light-shielding film 2 to be left, protecting second antireflective layer 51 in the area where light-shielding film 2 is to be left (FIG. 13E). By chlorine dry etching (dry etching with chlorine and oxygen), etch stop film 9 is etched for forming openings in the area where halftone phase shift film 8 is to be removed and removing second antireflective layer 51 in the area where light-shielding film 2 is to be removed (FIG. 13F). Fluorine dry etching is then performed, whereby the portion of halftone phase shift film 8 to be removed (in register with the openings in second antireflective layer 51) is removed and those portions of first antireflective layer 31 and light-shielding film 2 which are not protected by second resist film 7 and second antireflective layer 51 are removed (FIG. 13G). Thereafter, chlorine dry etching (dry etching with chlorine and oxygen) is performed again, removing the portion of etch stop film 9 which has been left in the area where light-shielding film 2 is to be removed. All the portions of the respective films to be removed are removed without damages to transparent substrate 1 and halftone phase shift film 8. Finally, the pattern of second resist film 7 is removed, completing a tritone phase shift mask (FIG. 13H).

If it is desired to leave a portion of the light-shielding film only at the light-shielding band (usually photomask periphery), the process may be modified such that after the antireflective film and light-shielding film are etched through the pattern of the first resist film, only the light-shielding band is protected by the second resist film. The subsequent steps are the same. By this modification, a general halftone phase shift mask is produced.

For photomasks in which a finally remaining light-shielding film pattern need not have a high accuracy, for example, general halftone phase shift masks in which a portion of the light-shielding film is left only at the light-shielding band (usually photomask periphery), it suffices that at least the phase shifter be processed at a high accuracy. In such a case, the use of the photomask blank of the third embodiment allows for processing even when the first resist film is considerably thin. The reason is that once a predetermined portion of the second antireflective layer is accurately etched through the first resist film, any underlying layer (or film) can be processed using the overlying layer (or film) as an etching mask.

It is sometimes observed that as the resist film becomes thicker, the aspect ratio of the resist pattern increases to induce degradation of the resolving capability of the resist. The photomask blank of the third embodiment is most effective for solving this problem because processing is possible even when the thickness of the first resist film is considerably thin, for example, as thin as 200 nm or less, and even of the order of 100 nm, when a chemically amplified resist comprising a resin derived mainly from a hydroxystyrene skeleton component is used.

Understandably, in the third embodiment, the antireflective film of chromium-based material, whose composition is determined so that it functions as an antireflective film, receives more damages by fluorine dry etching, as compared with the use of the etching mask film. It is then necessary to set the resist film at a necessary thickness during lithography using the second resist.

It is also possible to produce a zebra type chromeless mask from the photomask blank of the third embodiment. The production process involves a dry etching step using as an etching mask the surface layer of the outermost antireflective layer which is not protected by the resist. In view of the above-described characteristics of the antireflective film of chromium-based material, the constituent films of the photomask blank must be designed while taking into account the amount of the antireflective film which is lost during the step.

(8) The Photomask Manufacturing Process H Wherein the Photomask Blank of the Fourth Embodiment is Processed Into a Photomask (Halftone Phase Shift Mask)

Figure 14A:
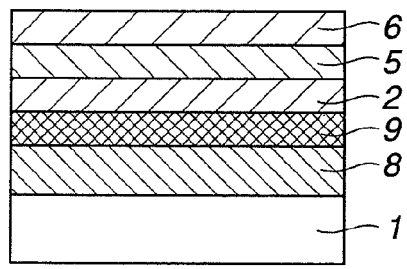
Figure 14B:
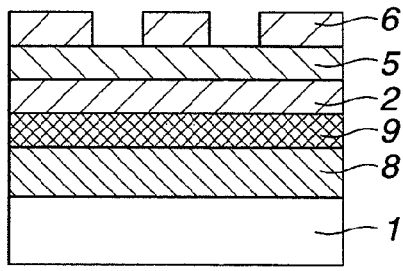
Figure 14C:
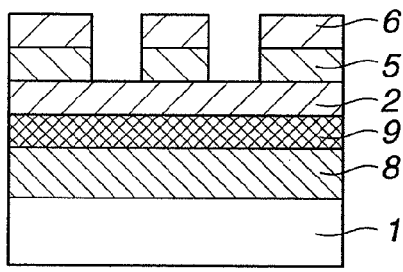
Figure 14D:
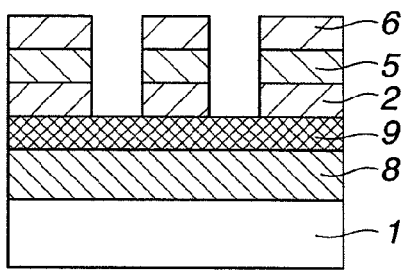

The process starts with a photomask blank comprising a halftone phase shift film 8 susceptible to fluorine dry etching, an etch stop film 9 resistant to fluorine dry etching and removable by chlorine dry etching, a light-shielding film 2 susceptible to fluorine dry etching, and an antireflective film 5 resistant to fluorine dry etching and removable by chlorine dry etching, deposited on a transparent substrate 1 in the described sequence (FIG. 4B). A first resist film 6 is coated onto the blank (FIG. 14A) and then processed to form a pattern of first resist film 6 corresponding to the configuration of a portion of halftone phase shift film 8 to be left (FIG. 14B). With the pattern of first resist film 6 serving as an etching mask, chlorine dry etching (dry etching with chlorine and oxygen) is then performed for transferring the pattern of first resist film 6 to antireflective film 5 (FIG. 14C). Fluorine dry etching is then performed for transferring the pattern of antireflective film 5 to light-shielding film 2 (FIG. 14D).

Figure 14E:
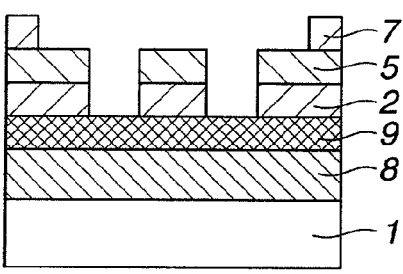
Figure 14F:
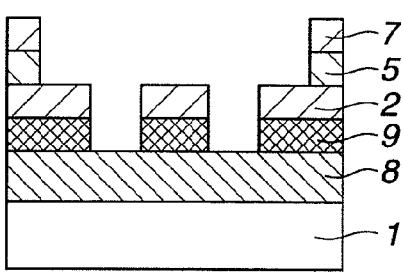
Figure 14G:
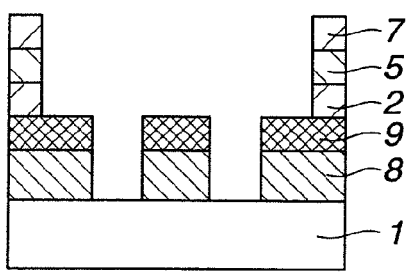
Figure 14H:
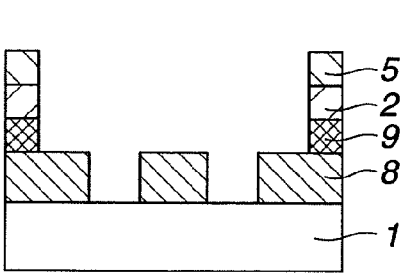

Once first resist film 6 is stripped, a second resist film 7 is coated again. The second resist film 7 is processed into a pattern corresponding to the portion of light-shielding film 2 to be left, protecting antireflective film 5 in the area where light-shielding film 2 is to be left (FIG. 14E). By chlorine dry etching (dry etching with chlorine and oxygen), etch stop film 9 is etched for forming openings in the area where halftone phase shift film 8 is to be removed and removing antireflective film 5 in the area where the pattern of second resist film 7 is not formed (FIG. 14F). Fluorine dry etching is then performed, whereby the portion of halftone phase shift film 8 to be removed (in register with the openings in etch stop film 9) is removed and those portions of light-shielding film 2 which are exposed after removal of antireflective film 5 by etching through the pattern of second resist film 7 (FIG. 14G). Thereafter, chlorine dry etching (dry etching with chlorine and oxygen) is performed again, removing the portion of etch stop film 9 which is exposed after removal of light-shielding film 2. All the portions of the respective films to be removed are removed without damages to transparent substrate 1 and halftone phase shift film 8. Finally, second resist film 7 is removed, completing a halftone phase shift mask (FIG. 14H).

Since the photomask blank of the fourth embodiment has similar etching characteristics to the photomask blank of the third embodiment, a tritone phase shift mask or Levenson mask may be produced by the same procedure as in the photomask blank of the third embodiment. In the photomask blank of the fourth embodiment, etch processing is possible with a resist film having a thickness of up to 250 nm. On the other hand, an increased thickness of an antireflective film resistant to fluorine dry etching deposited on a light-shielding film susceptible to fluorine dry etching ensures masking during subsequent etching steps even if the resist film is damaged in transferring the pattern of the first resist film. This increases the accuracy of pattern transfer to any film underlying the antireflective film and the transparent substrate.

(9) The Photomask Manufacturing Process I Wherein the Photomask Blank of the Fifth Embodiment is Processed Into a Photomask (Halftone Phase Shift Mask)

Figure 15A:
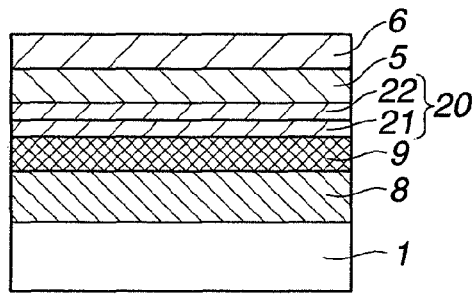
Figure 15B:
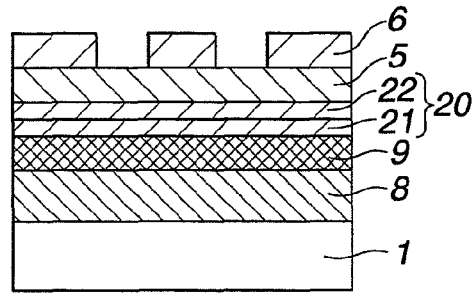
Figure 15C:
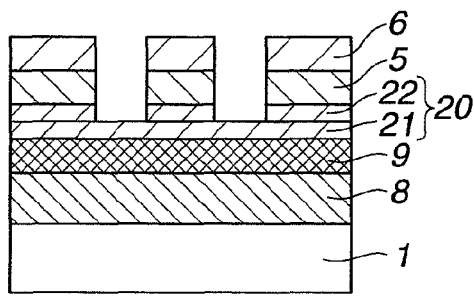
Figure 15D:
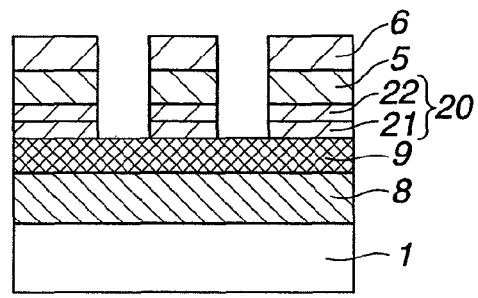

The process starts with a photomask blank comprising a halftone phase shift film 8 susceptible to fluorine dry etching, an etch stop film 9 resistant to fluorine dry etching and removable by chlorine dry etching, a light-shielding film 20 including a first light-shielding layer 21 susceptible to fluorine dry etching and a second light-shielding layer 22 resistant to fluorine dry etching, and an antireflective film 5 resistant to fluorine dry etching, deposited on a transparent substrate 1 in the described sequence (FIG. 5B). A first resist film 6 is coated onto the blank (FIG. 15A) and then developed to form a pattern of first resist film 6 corresponding to the configuration of a portion of halftone phase shift film 8 to be left (FIG. 15B). With the pattern of first resist film 6 serving as an etching mask, chlorine dry etching (dry etching with chlorine and oxygen) is then performed for transferring the pattern of first resist film 6 to antireflective film 5 and second light-shielding layer 22 (FIG. 15C). Fluorine dry etching is then performed for transferring the pattern of second light-shielding layer 22 to first light-shielding layer 21 (FIG. 15D).

Figure 15E:
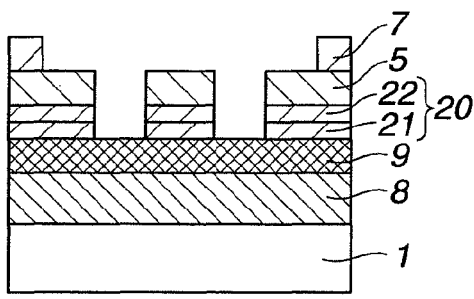
Figure 15F:
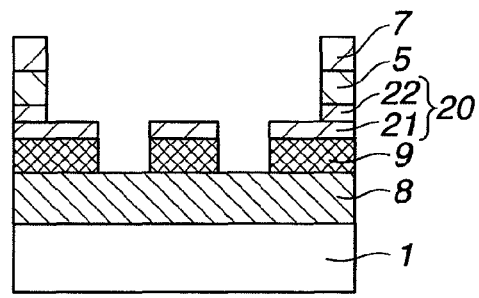
Figure 15G:
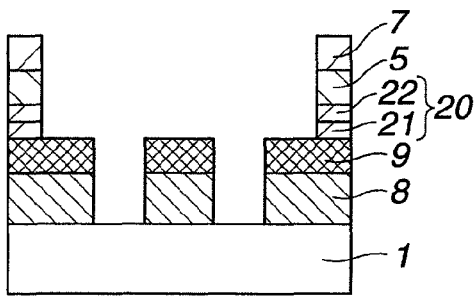
Figure 15H:
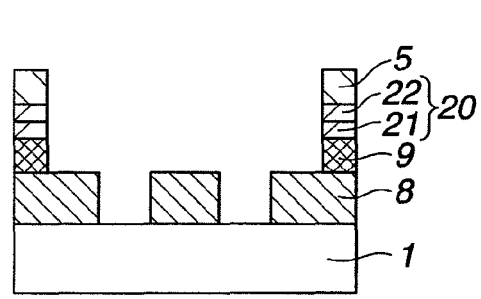

Once first resist film 6 is stripped, a second resist film 7 is coated again. The second resist film 7 is processed into a pattern corresponding to the portion of light-shielding film 20 to be left, protecting antireflective film 5 in the area where light-shielding film 20 is to be left (FIG. 15E). By chlorine dry etching (dry etching with chlorine and oxygen), etch stop film 9 is etched for forming openings in the area where halftone phase shift film 8 is to be removed and removing antireflective film 5 in the area where light-shielding film 20 is to be removed and second light-shielding layer 22 (FIG. 15F). Fluorine dry etching is then performed, whereby the portion of halftone phase shift film 8 to be removed (in register with the openings in second light-shielding layer 22) is removed and those portions of first light-shielding layer 21 which are not protected by second resist film 7, antireflective film 5 and second light-shielding layer 22 (FIG. 15G). Thereafter, chlorine dry etching (dry etching with chlorine and oxygen) is performed again, removing the portion of etch stop film 9 which is left in the area where light-shielding film 2 is to be removed. All the portions of the respective films to be removed are removed without damages to transparent substrate 1 and halftone phase shift film 8. Finally, the pattern of second resist film 7 is stripped, completing a halftone phase shift mask (FIG. 15H).

Since the photomask blank of the fifth embodiment has similar etching characteristics to the photomask blank of the third embodiment, a tritone phase shift mask or Levenson mask may be produced by the same procedure as in the photomask blank of the third embodiment. In the photomask blank of the fifth embodiment, the second light-shielding layer is expected to exert a greater etching mask effect. Even if the resist film is damaged in transferring the pattern of the first resist film, this ensures pattern transfer at a high accuracy to any film (or layer) underlying the second light-shielding layer and the transparent substrate.

It is noted that the resist used in the manufacture of photomasks according to the invention may be either a negative resist or a positive resist. A choice of a particular resist depends on the efficiency of distribution of a mask pattern.

EXAMPLE

Experiments and Examples are given below for further illustrating the invention although the invention is not limited thereto.

In Examples, fluorine dry etching was performed by feeding only $C_2F_6$ gas into a chamber at a flow rate of 20 sccm, and setting a pressure of 2 Pa in the chamber. Chlorine dry etching is performed by feeding chlorine gas at a flow rate of 20 sccm, oxygen gas at 20 sccm and helium gas at 80 sccm into a chamber, and setting a pressure of 2 Pa in the chamber.

Experiment 1

By selecting one of targets containing molybdenum and silicon in an atomic ratio of 0:100, 1:15, 1:9, 1:4, 1:2, and 1:1 and sputtering the target in an argon atmosphere, a molybdenum silicide film of 39 nm thick was deposited (the film having a molybdenum/silicon ratio corresponding to the selected target). The molybdenum silicide films were immersed in aqueous ammonia/hydrogen peroxide (aqueous ammonia:hydrogen peroxide:water=1:1:30 in volume ratio) for one hour, after which a change of film thickness was determined. The film thickness losses were 0.2, 0.2, 0.7, 1.5, 17.7, and 39 nm, respectively. The films were also measured for electric conductivity using a four-probe sheet resistance meter MCP-T600 (Mitsubishi Chemical Co., Ltd.), finding conductivity values of 1082, 680, 486, 296, 96, and 38 ohm/square (Ω/□), respectively.

With regard to these materials for light-shielding film and antireflective film (ARF), it was found that when the ratio of transition metal to silicon is in a range from 1:4 to 1:15 in atomic ratio, the resulting films have chemical resistance against intense chemical cleaning and an electric conductivity within a practically acceptable range, without a need for optimization of a nitrogen content or the like.

Example 1

A photomask blank having the layer arrangement shown in FIG. 1A was prepared by depositing the films by sputtering. The respective films are as follows.
Transparent substrate: quartz substrate
Etch stop film: CrN (Cr:N=9:1 in atomic ratio, thickness 10 nm)
Light-shielding film: MoSi (Mo:Si=1:4 in atomic ratio, thickness 41 nm)
ARF: MoSiN (thickness-wise compositional grading from Mo:Si:N=1:3:1.5 in atomic ratio on light-shielding film side to Mo:Si:N=1:5:5 in atomic ratio on side remote from transparent substrate (surface side), thickness 18 nm)

This photomask blank was processed in accordance with photomask manufacturing process A, whereby a Levenson mask was produced. For the first and second resist films, a chemically amplified negative resist mainly comprising a hydroxystyrene resin, a crosslinker, and a photoacid generator was used to form a resist film of 250 nm thick. The resist films were patterned by EB lithography. Before formation of the first resist film, the surface of the photomask, specifically the surface of the antireflective film was treated with hexamethyl disilazane (HMDS). The phase shifter formed in the transparent substrate had a depth of 172 nm, which produces a phase shift of about 180°.

As a result, a photomask which faithfully reflected the preselected pattern size was produced independent of pattern density. It was demonstrated that the photomask blank has minimal pattern density dependency. Since no erosion occurred on the substrate during etching of the light-shielding film, a phase shifter having the predetermined value of phase shift could be formed in the substrate at a high accuracy.

Examples 2 and 3

Photomask blanks having the layer arrangement shown in FIG. 1A were prepared as in Example 1 except that the light-shielding film was of MoSiN having a nitrogen content of 5 atom % (Mo:Si:N=1:3:0.2 in atomic ratio, thickness 23 nm) in Example 2 or of MoSiN having a nitrogen content of 13 atom % (Mo:Si:N=1:3:0.6 in atomic ratio, thickness 23 nm) in Example 3. These photomask blanks were processed in accordance with photomask manufacturing process A, whereby Levenson masks were produced. Sufficient resistance to oxygen-containing chlorine dry etching was confirmed. In the course of processing the blank of Example 2, an intermediate sample was obtained by stripping the resist film from the workpiece at the stage when the ARF and light-shielding film were patterned using the resist pattern, and the etch stop film was etched. This intermediate sample was sectioned and observed under a microscope. FIG. 16 is a photomicrograph of this light-shielding pattern section. FIG. 16 is a section of a film pattern (pattern width 0.2 μm) having etch stop film 9, light-shielding film 2 of MoSiN, and ARF 3 of MoSiN deposited on a transparent substrate 1 in the described sequence. As seen from the photo, the film pattern is very good in perpendicularity.

Example 4 and Comparative Example

A photomask blank having the layer arrangement shown in FIG. 1B was prepared by depositing the films by sputtering. The respective films are as follows.
Transparent substrate: quartz substrate
Halftone phase shift film: MoSiON (Mo:Si:O:N=1:4:1:4 in atomic ratio, thickness 75 nm)
Etch stop film: CrN (Cr:N=9:1 in atomic ratio, thickness 10 nm)
Light-shielding film: MoSiN (Mo:Si:N=1:3:1.5 in atomic ratio, thickness 23 nm)
ARF: MoSiN (thickness-wise compositional grading from Mo:Si:N=1:3:1.5 in atomic ratio on light-shielding film side to Mo:Si:N=1:5:5 in atomic ratio on side remote from transparent substrate (surface side), thickness 18 nm)

For comparison purposes, a photomask blank was prepared in which the light-shielding film was formed solely of prior art chromium-based material. The photomask blank of Comparative Example is a blank comprising a light-shielding film and an ARF both of chromium-based material, and a halftone phase shift film of MoSiON as currently commonly used as the photomask blank for ArF lithography mask.

Specifically, a photomask blank as shown in FIG. 18 was prepared. On a transparent substrate 1, a MoSiON film (Mo:Si:O:N=1:4:1:4, thickness 75 nm) as a halftone phase shift film 8, a CrN film (Cr:N=9:1, thickness 26 nm) as a light-shielding film 23, and a CrON film (Cr:O:N=4:5:1, thickness 20 nm) as an ARF 5 were formed in sequence by sputtering.

These photomask blanks were evaluated for global loading and CD linearity.

For global loading evaluation, a photomask was prepared as follows. First, a photosensitive resist (IP3500 by Tokyo Ohka Kogyo Co., Ltd.) was coated by means of a spin coater, and heated for baking. At this point, the resist film had a thickness of about 450 nm, as measured by a probe type film gauge. The resist film was written imagewise by means of a laser lithography system ALTA 3700 (Applied Material Inc.) and developed, forming a test pattern. The test pattern has patterns including spaces with a size 1.0 μm arranged at total 121 (=11×11) points in a 132 mm square region on a 6-inch square substrate. In certain zones, portions (dark portions) having a low write density proximate to the pattern and a relatively small etched area are provided. In the remaining zones, portions (clear portions) having a high write density proximate to the pattern and a relatively large etched area are provided. Thereafter, each of the photomask blanks of Example and Comparative Example was dry etched and processed through consecutive steps until halftone phase shift masks were completed. Then the pattern size was measured using a measurement tool LWM (Leica).

The halftone phase shift mask using Cr-based light-shielding film of Comparative Example showed a global loading tendency that the clear portions had a noticeably large space size than the dark portions. In contrast, the halftone phase shift mask produced from the photomask blank of Example showed a minimized global loading effect. Specifically, the difference in average values between the dark portion size and the clear portion size was about 15 nm in the halftone phase shift mask of Comparative Example, but was about 1 nm in the halftone phase shift mask produced from the photomask blank of Example, demonstrating an apparent effect.

For CD linearity evaluation, a photomask was produced as follows. A negative chemically amplified EB resist was coated on the photomask blank by means of a spin coater and baked to form a resist film of 200 nm thick. This was followed by a series of steps including EB writing, PEB, development, and dry etching, completing a halftone phase shift mask. The line width was measured by a SEM line width measuring system.

The data of linearity are plotted in the graph of FIG. 17. FIG. 17 shows the results of measurement on the lines of a line-and-space pattern having a line density of 50%. The halftone phase shift mask of Comparative Example shows the tendency that dry etching amenability becomes worse as the line width becomes narrower. That is, as the design CD (on the abscissa) becomes smaller, an offset of line width from the design CD (ΔCD on the ordinate) becomes larger. In contrast, the halftone phase shift mask of Example shows a dramatic decline of the tendency, i.e., excellent patterning characteristics.

It is seen from FIG. 17 that, as compared with Comparative Example (prior art), Example (the invention) is somewhat superior at a line width equal to or less than 0.8 μm and superior at a line width equal to or less than 0.4 μm. Then the photomask blank of the invention is effective in producing a photomask having a pattern with a feature size equal to or less than 0.8 μm and most effective in producing a photomask having a pattern with a feature size equal to or less than 0.4 μm.

Example 5

A photomask blank having the layer arrangement shown in FIG. 2A was prepared by depositing the films by sputtering. The respective films are as follows.
Transparent substrate: quartz substrate
Etch stop film: CrN (Cr:N=9:1 in atomic ratio, thickness 10 nm)
Light-shielding film: MoSiN (Mo:Si:N=1:3:1.5 in atomic ratio, thickness 41 nm)
ARF: MoSiN (thickness-wise compositional grading from Mo:Si:N=1:3:1.5 in atomic ratio on light-shielding film side to Mo:Si:N=1:5:5 in atomic ratio on side remote from transparent substrate (etching mask film side), thickness 18 nm)
Etching mask film: CrN (Cr:N=9:1 in atomic ratio, thickness 10 nm)

This photomask blank was processed in accordance with photomask manufacturing process C, whereby a Levenson mask was produced. For the first and second resist films, a chemically amplified negative resist mainly comprising a hydroxystyrene resin, a crosslinker, and a photoacid generator was used to form a resist film of 250 nm thick. The resist films were patterned by EB lithography. The phase shifter formed in the transparent substrate had a depth of 172 nm, which produces a phase shift of about 180°.

As a result, a photomask which faithfully reflected the preselected pattern size was produced independent of pattern density. It was demonstrated that the photomask blank has minimal pattern density dependency. Since no erosion occurred on the substrate during etching of the light-shielding film, a phase shifter having the predetermined value of phase shift could be formed in the substrate at a high accuracy.

Example 6

A photomask blank having the layer arrangement shown in FIG. 2A was prepared by depositing the films by sputtering. The respective films are as follows.
Transparent substrate: quartz substrate
Etch stop film: CrN (Cr:N=9:1 in atomic ratio, thickness 10 nm)
Light-shielding film: MoSiN (Mo:Si:N=1:3:1.5 in atomic ratio, thickness 41 nm)
ARF: MoSiN (thickness-wise compositional grading from Mo:Si:N=1:3:1.5 in atomic ratio on light-shielding film side to Mo:Si:N=1:5:5 in atomic ratio on side remote from transparent substrate (etching mask film side), thickness 18 nm)
Etching mask film: CrN (Cr:N=9:1 in atomic ratio, thickness 10 nm)

This photomask blank was processed in accordance with photomask manufacturing process D, whereby a zebra type chromeless mask was produced. For the first and second resist films, a chemically amplified negative resist mainly comprising a hydroxystyrene resin, a crosslinker, and a photoacid generator was used to form a resist film of 200 nm thick. The resist films were patterned by EB lithography. The phase shifter formed in the transparent substrate had a depth of 172 nm, which produces a phase shift of about 180°.

As a result, a photomask which faithfully reflected the preselected pattern size was produced independent of pattern density. It was demonstrated that the photomask blank has minimal pattern density dependency. Since no erosion occurred on the substrate during etching of the light-shielding film, a phase shifter having the predetermined value of phase shift could be formed in the substrate at a high accuracy.

Example 7

A photomask blank having the layer arrangement shown in FIG. 2B was prepared by depositing the films by sputtering. The respective films are as follows.
Transparent substrate: quartz substrate
Halftone phase shift film: MoSiON (Mo:Si:O:N=1:4:1:4 in atomic ratio, thickness 75 nm)
Etch stop film: CrN (Cr:N=9:1 in atomic ratio, thickness 10 nm)
Light-shielding film: MoSiN (Mo:Si:N=1:3:1.5 in atomic ratio, thickness 41 nm)
ARF: MoSiN (thickness-wise compositional grading from Mo:Si:N=1:3:1.5 in atomic ratio on light-shielding film side to Mo:Si:N=1:5:5 in atomic ratio on side remote from transparent substrate (etching mask film side), thickness 18 nm)
Etching mask film: CrN (Cr:N=4:1 in atomic ratio, thickness 10 nm)

This photomask blank was processed in accordance with photomask manufacturing process E, whereby a tritone phase shift mask was produced. For the first and second resist films, a chemically amplified negative resist mainly comprising a hydroxystyrene resin, a crosslinker, and a photoacid generator was used to form a resist film of 250 nm thick. The resist films were patterned by EB lithography.

As a result, a photomask which faithfully reflected the preselected pattern size was produced independent of pattern density. It was demonstrated that the photomask blank has minimal pattern density dependency. Since no erosion occurred on the phase shift film and substrate during etching of the light-shielding film, a phase shifter having the predetermined value of phase shift could be formed in the substrate at a high accuracy.

Example 8

A photomask blank having the layer arrangement shown in FIG. 3A was prepared by depositing the films by sputtering. The respective films are as follows.
Transparent substrate: quartz substrate
Etch stop film: CrN (Cr:N=9:1 in atomic ratio, thickness 10 nm)

Light-shielding film: MoSiN (Mo:Si:N=1:3:1.5 in atomic ratio, thickness 41 nm)
1st ARF: MoSiN (thickness-wise compositional grading from Mo:Si:N=1:3:1.5 in atomic ratio on light-shielding film side to Mo:Si:N=1:5:5 in atomic ratio on side remote from transparent substrate (2nd ARF side), thickness 10 nm)
2nd ARF: CrON (Cr:O:N=4:5:1 in atomic ratio, thickness 8 nm)

This photomask blank was processed in accordance with photomask manufacturing process F, whereby a Levenson mask was produced. For the first and second resist films, a chemically amplified negative resist mainly comprising a hydroxystyrene resin, a crosslinker, and a photoacid generator was used to form a resist film of 200 nm thick. The resist films were patterned by EB lithography. The phase shifter formed in the transparent substrate had a depth of 172 nm, which produces a phase shift of about 180°.

As a result, a photomask which faithfully reflected the preselected pattern size was produced independent of pattern density. It was demonstrated that the photomask blank has minimal pattern density dependency. Since no erosion occurred on the substrate during etching of the light-shielding film, a phase shifter having the predetermined value of phase shift could be formed in the substrate at a high accuracy.

Example 9

A photomask blank having the layer arrangement shown in FIG. 3B was prepared by depositing the films by sputtering. The respective films are as follows.
Transparent substrate: quartz substrate
Halftone phase shift film: MoSiON (No:Si:O:N=1:4:1:4 in atomic ratio, thickness 75 nm)
Etch stop film: CrN (Cr:N=9:1 in atomic ratio, thickness 10 nm)
Light-shielding film: MoSiN (Mo:Si:N=1:3:1.5 in atomic ratio, thickness 23 nm)
1st ARF: MoSiN (thickness-wise compositional grading from Mo:Si:N=1:3:1.5 in atomic ratio on light-shielding film side to Mo:Si:N=1:5:5 in atomic ratio on side remote from transparent substrate (2nd ARF side), thickness 10 nm)
2nd ARF: CrON (Cr:O:N=4:5:1 in atomic ratio, thickness 8 nm)

This photomask blank was processed in accordance with photomask manufacturing process G, whereby a tritone phase shift mask was produced. For the first and second resist films, a chemically amplified negative resist mainly comprising a hydroxystyrene resin, a crosslinker, and a photoacid generator was used to form a resist film of 100 nm thick. The resist films were patterned by EB lithography.

As a result, a photomask which faithfully reflected the preselected pattern size was produced independent of pattern density. It was demonstrated that the photomask blank has minimal pattern density dependency. Since no erosion occurred on the phase shift film and substrate during etching of the light-shielding film, a phase shifter having the predetermined value of phase shift could be formed in the substrate at a high accuracy.

Example 10

A photomask blank having the layer arrangement shown in FIG. 4B was prepared by depositing the films by sputtering. The respective films are as follows.
Transparent substrate: quartz substrate
Halftone phase shift film: MoSiON (Mo:Si:O:N=1:4:1:4 in atomic ratio, thickness 75 nm)
Etch stop film: CrN (Cr:N=9:1 in atomic ratio, thickness 10 nm)
Light-shielding film: MoSiN (Mo:Si:N=1:3:1.5 in atomic ratio, thickness 23 nm)
ARF: CrON (Cr:O:N=4:5:1 in atomic ratio, thickness 18 nm)

This photomask blank was processed in accordance with photomask manufacturing process H, whereby a halftone phase shift mask was produced. For the first and second resist films, a chemically amplified negative resist mainly comprising a hydroxystyrene resin, a crosslinker, and a photoacid generator was used to form a resist film of 100 nm thick. The resist films were patterned by EB lithography.

As a result, a photomask which faithfully reflected the preselected pattern size was produced independent of pattern density. It was demonstrated that the photomask blank has minimal pattern density dependency. Since no erosion occurred on the phase shift film and substrate during etching of the light-shielding film, a phase shifter having the predetermined value of phase shift could be formed in the substrate at a high accuracy.

Example 11

A photomask blank having the layer arrangement shown in FIG. 5B was prepared by depositing the films by sputtering. The respective films are as follows.
Transparent substrate: quartz substrate
Halftone phase shift film: MoSiON (Mo:Si:O:N=1:4:1:4 in atomic ratio, thickness 75 nm)
Etch stop film: CrN (Cr:N=9:1 in atomic ratio, thickness 10 nm)
1st light-shielding layer: MoSiN (Mo:Si:N=1:3:1.5 in atomic ratio, thickness 20 nm)
2nd light-shielding layer: CrN (Cr:N=4:1 in atomic ratio, thickness 5 nm)
ARF: CrON (Cr:O:N=4:5:1 in atomic ratio, thickness 20 nm)

This photomask blank was processed in accordance with photomask manufacturing process I, whereby a halftone phase shift mask was produced. For the first and second resist films, a chemically amplified negative resist mainly comprising a hydroxystyrene resin, a crosslinker, and a photoacid generator was used to form a resist film of 250 nm thick. The resist films were patterned by EB lithography.

As a result, a photomask which faithfully reflected the preselected pattern size was produced independent of pattern density. It was demonstrated that the photomask blank has minimal pattern density dependency. Since no erosion occurred on the phase shift film and substrate during etching of the light-shielding film, a phase shifter having the predetermined value of phase shift could be formed in the substrate at a high accuracy.

Japanese Patent Application No. 2006-065800 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A photomask comprising a transparent substrate and a mask pattern formed thereon, said mask pattern comprising transparent regions, phase shift regions and light-shielding regions, and said mask pattern comprising
  an etch stop film disposed on the substrate with another film intervening therebetween, said etch stop film of single layer or multilayer construction being resistant to fluorine dry etching and removable by chlorine dry etching, said another film comprising a halftone phase shift film, a light-shielding film disposed contiguous to said etch stop film and consisting of a single layer or multiple layers composed of a material containing a transition metal and silicon, and an antireflective film disposed contiguous to said light-shielding film and consisting of a single layer or multiple layers, wherein said transition metal is at least one element selected from the group consisting of titanium, vanadium, cobalt, nickel, zirconium, niobium, molybdenum, hafnium, tantalum, and tungsten, and an optical density OD of the combination of phase shift film, etch stop film, light-shielding film and antireflective film is at least 2.5.

2. The photomask of claim 1, wherein said etch stop film is composed of chromium alone or a chromium compound containing chromium and at least one element selected from oxygen, nitrogen and carbon.

3. The photomask of claim 1, wherein said etch stop film is composed of tantalum alone or a tantalum compound containing tantalum and free of silicon.

4. The photomask of claim 1, wherein said etch stop film has a thickness of 2 to 20 nm.

5. The photomask of claim 1, wherein the material of which the layer of said light-shielding film is composed is an alloy of a transition metal with silicon or a transition metal silicon compound containing a transition metal, silicon and at least one element selected from oxygen, nitrogen and carbon.

6. The photomask of claim 1, wherein the material of which the layer of said light-shielding film is composed is a transition metal silicon compound containing a transition metal, silicon and nitrogen.

7. The photomask of claim 6, wherein said light-shielding film has a nitrogen content of 5 atom % to 40 atom %.

8. The photomask of claim 1, wherein said light-shielding film consists of multiple layers, among which a layer disposed contiguous to said antireflective film has an extinction coefficient k of at least 1.5 relative to exposure light.

9. The photomask of claim 1, wherein said light-shielding film has a thickness of 10 to 80 nm.

10. The photomask of claim 1, wherein said antireflective film includes a layer of a transition metal silicon compound containing a transition metal, silicon, and oxygen and/or nitrogen.

11. The photomask of claim 1, wherein said antireflective film includes a layer of chromium alone or chromium compound containing chromium and oxygen and/or nitrogen.

12. The photomask of claim 1, wherein said antireflective film consists of two layers, a first antireflective layer formed adjacent to the transparent substrate and a second antireflective layer formed remote from the transparent substrate, the first antireflective layer is composed of a transition metal silicon compound comprising a transition metal, silicon and oxygen and/or nitrogen, and the second antireflective layer is composed of a chromium compound containing chromium and oxygen and/or nitrogen.

13. The photomask of claim 11, wherein said antireflective film, the layer of chromium compound has a chromium content of at least 50 atom %.

14. The photomask of claim 1, further comprising an etching mask film disposed contiguous to said antireflective film and consisting of a single layer or multiple layers which are resistant to fluorine dry etching and removable by chlorine dry etching.

15. The photomask of claim 14, wherein said etching mask film is composed of chromium alone or a chromium compound containing chromium and at least one element selected from oxygen, nitrogen and carbon.

16. The photomask of claim 14, wherein said etching mask film has a thickness of 2 to 30 nm.

17. The photomask of claim 10, wherein said transition metal of said antireflective film is at least one element selected from the group consisting of titanium, vanadium, cobalt, nickel, zirconium, niobium, molybdenum, hafnium, tantalum, and tungsten.

18. The photomask of claim 1, wherein said transition metal is molybdenum.

19. The manufacturing process of a photomask of claim 1, said photomask being a tritone phase shift mask, said process comprising steps of:

providing a photomask blank comprising a transparent substrate, an etch stop film disposed on the substrate with another film intervening therebetween, said etch stop film of single layer or multilayer construction being resistant to fluorine dry etching and removable by chlorine dry etching, said another film comprising a halftone phase shift film, a light-shielding film disposed contiguous to said etch stop film and consisting of a single layer or multiple layers composed of a material containing a transition metal and silicon, and an antireflective film disposed contiguous to said light-shielding film and consisting of a single layer or multiple layers, wherein said transition metal is at least one element selected from the group consisting of titanium, vanadium, cobalt, nickel, zirconium, niobium, molybdenum, hafnium, tantalum, and tungsten, and an optical density OD of the combination of phase shift film, etch stop film, light-shielding film and antireflective film is at least 2.5;

coating a first resist film onto the blank;

processing the first resist film to form a pattern corresponding to the configuration of a portion of the halftone phase shift film to be left;

transferring the pattern of first resist film to the antireflective film and light-shielding film by fluorine dry etching;

etching the etch stop film by chlorine dry etching to form an opening at the area where halftone phase shift film is to be removed;

stripping the first resist film:

coating a second resist film;

processing the second resist film into a pattern corresponding to the configuration of a portion of light-shielding film is to be left, for protecting the light-shielding film and antireflective film:

removing a portion of the halftone phase shift film in register with the opening in the etch stop film, and portions of the antireflective film and light-shielding film which are not protected by the second resist film, by fluorine dry etching and;

etching a portion of the etch stop film which is not protected by the second resist film, by chlorine dry etching.

20. A manufacturing process of a photomask of claim 1, said photomask being a tritone phase shift mask, said process comprising steps of:

providing a photomask blank comprising a transparent substrate, an etch stop film disposed on the substrate with another film intervening therebetween, said etch stop film of single layer or multilayer construction being resistant to fluorine dry etching and removable by chlorine dry etching, said another film comprising a halftone phase shift film, a light-shielding film disposed contiguous to said etch stop film and consisting of a single layer or multiple layers composed of a material containing a transition metal and silicon, an antireflective film disposed contiguous to said light-shielding film and consisting of a single layer or multiple layers, and an etching mask film disposed contiguous to said antireflective film and consisting of a single layer or multiple layers which are resistant to fluorine dry etching and removable by chlorine dry etching, wherein said transition metal is at least one element selected from the group consisting of titanium, vanadium, cobalt, nickel, zirconium, niobium, molybdenum, hafnium, tantalum, and tungsten, and an optical density OD of the combination of phase shift film, etch stop film, light-shielding film and antireflective film is at least 2.5;

coating a first resist film onto the blank;

processing the first resist film to form a pattern corresponding to the configuration of a portion of the halftone phase shift film to be left;

transferring the pattern of first resist film to the etching mask film by chlorine dry etching;

transferring the pattern of etching mask film to the antireflective film and light-shielding film by fluorine dry etching;

stripping the first resist film;

coating a second resist film;

processing the second resist film into a pattern corresponding to the configuration of a portion of light-shielding film to be left, for protecting the area of etching mask film where light-shielding film is to be left;

etching the etch stop film to form an opening at the area where halftone phase shift film is to be removed, and the etching mask film in the area where light-shielding film is to be removed, by chlorine dry etching;

removing a portion of the halftone phase shift film in register with the opening in the etch stop film, and portions of the antireflective film and light-shielding film which are not protected by the etching mask film, by fluorine dry etching;

stripping the second resist film; and removing a portion of etch stop film which is left in the area where light-shielding film is to be removed, and a portion of etching mask film overlying the antireflective film on the unremoved light-shielding film, by chlorine dry etching.

21. A manufacturing process of a photomask of claim 1, said photomask being a tritone phase shift mask, said process comprising steps of:

providing a photomask blank comprising a transparent substrate, an etch stop film disposed on the substrate with another film intervening therebetween, said etch stop film of single layer or multilayer construction being resistant to fluorine dry etching and removable by chlorine dry etching, said another film comprising a halftone phase shift film, a light-shielding film disposed contiguous to said etch stop film and consisting of a single layer or multiple layers composed of a material containing a transition metal and silicon, and an antireflective film disposed contiguous to said light-shielding film and consisting of a single layer or multiple layers, wherein said antireflective film consists of two layers, a first antireflective layer formed adjacent to the transparent substrate and a second antireflective layer formed remote from the transparent substrate, the first antireflective layer is susceptible to fluorine dry etching, and the second antireflective layer is resistant to fluorine dry etching, said transition metal is at least one element selected from the group consisting of titanium, vanadium, cobalt, nickel, zirconium, niobium, molybdenum, hafnium, tantalum, and tungsten, and an optical density OD of the combination of phase shift film, etch stop film, light-shielding film and antireflective film is at least 2.5;

coating a first resist film onto the blank;

processing the first resist film to form a pattern corresponding to the configuration of a portion of the halftone phase shift film to be left;

transferring the pattern of first resist film to the second antireflective layer by chlorine dry etching:

transferring the pattern of second antireflective layer to the first antireflective layer and light-shielding film by fluorine dry etching;

stripping the first resist film;

coating a second resist film;

processing the second resist film into a pattern corresponding to the configuration of a portion of light-shielding film to be left, for protecting the area of second antireflective layer where light-shielding film is to be left;

etching the etch stop film by chlorine dry etching to form an opening at the area where halftone phase shift film is to be removed, and the second antireflective layer in the area where light-shielding film is to be removed;

removing a portion of the halftone phase Shift film in register with the opening in the etch stop film, and portions of the first antireflective layer and light-shielding film which are not protected by the second antireflective layer, by fluorine dry etching;

removing a portion of etch stop film which is left in the area where light-shielding film is to be removed by chlorine dry etching; and stripping the second resist film.

22. A manufacturing process of a photomask of claim 1, said photomask being a halftone phase shift mask, said process comprising steps of:

providing a photomask blank comprising a transparent substrate, an etch stop film disposed on the substrate with another film intervening therebetween, said etch stop film of single layer or multilayer construction being resistant to fluorine dry etching and removable by chlorine dry etching, said another film comprising a halftone phase shift film, a light-shielding film disposed contiguous to said etch stop film and consisting of a single layer or multiple layers composed of a material containing a transition metal and silicon, and an antireflective film disposed contiguous to said light-shielding film and consisting of a single layer or multiple layers, wherein said transition metal is at least one element selected from the group consisting of titanium, vanadium, cobalt, nickel, zirconium, niobium, molybdenum, hafnium, tantalum, and tungsten, and an optical density OD of the combination of phase shift film, etch stop film, light-shielding film and antireflective film is at least 2.5;

coating a first resist film onto the blank;

processing the first resist film to form a pattern corresponding to the configuration of a portion of the halftone phase shift film to be left;

transferring the pattern of first resist film to the antireflective film by chlorine dry etching;

transferring the pattern of antireflective film to the light-shielding film by fluorine dry etching;

stripping the first resist film;

coating a second resist film;

processing the second resist film into a pattern corresponding to the configuration of a portion of light-shielding film to be left, for protecting the area of antireflective film where light-shielding film is to be left;

etching the etch stop film to form an opening at the area where halftone phase shift film is to be removed, and the antireflective film which is not protected by the second resist film, by chlorine dry etching;

removing a portion of the halftone phase shift film in register with the opening in the etch stop film, and a portion of the light-shielding film which is exposed after removal of antireflective film, by fluorine dry etching;

removing a portion of etch stop film which is exposed after removal of light-shielding film by chlorine dry etching; and stripping the second resist film.

23. A manufacturing process of a photomask of claim 1, said photomask being a halftone phase shift mask, said process comprising steps of:

providing a photomask blank comprising a transparent substrate, an etch stop film disposed on the substrate with another film intervening therebetween, said etch stop film of single layer or multilayer construction being resistant to fluorine dry etching and removable by chlorine dry etching, said another film comprising a halftone phase shift film, a light-shielding film disposed contiguous to said etch stop film and consisting of a single layer or multiple layers composed of a material containing a transition metal and silicon, and an antireflective film disposed contiguous to said light-shielding film and consisting of a single layer or multiple layers, wherein said light-shielding film consists of two layers, a first light-shielding layer formed adjacent to the transparent substrate and a second light-shielding layer formed remote from the transparent substrate, the first light-shielding layer is susceptible to fluorine dry etching, and the second light-shielding layer is resistant to fluorine dry etching, said transition metal is at least one element selected from the group consisting of titanium, vanadium, cobalt, nickel, zirconium, niobium, molybdenum, hafnium, tantalum, and tungsten, and an optical density OD of the combination of phase shift film, etch stop film, light-shielding film and antireflective film is at least 2.5;

coating a first resist film onto the blank;

processing the first resist film to form a pattern corresponding to the configuration of a portion of the halftone phase shift film to be left;

transferring the pattern of first resist film to the antireflective layer and second light-shielding layer by chlorine dry etching;

transferring the pattern of antireflective layer and second light-shielding layer to the first light-shielding layer by fluorine dry etching;

stripping the first resist film;

coating a second resist film;

processing the second resist film into a pattern corresponding to the configuration of a portion of light-shielding film to be left, for protecting the area of antireflective film where light-shielding film is to be left;

etching the etch stop film by chlorine dry etching to form an opening at the area where halftone phase shift film is to be removed, and the antireflective film and second light-shielding layer in the area where light-shielding film is to be removed;

removing a portion of the halftone phase shift film in register with the opening in the etch stop film, and a portion of the first light-shielding layer which is not protected by the antireflective film and second light-shielding layer, by fluorine dry etching;

removing a portion of etch stop film which is left in the area where light-shielding film is to be removed by chlorine dry etching; and stripping the second resist film.

* * * * *